(12) United States Patent
Wang et al.

(10) Patent No.: US 11,232,896 B2
(45) Date of Patent: Jan. 25, 2022

(54) INDUCTOR DESIGNS FOR REDUCING MAGNETIC INTERFERENCE

(71) Applicant: University of Florida Research Foundation, Incorporated, Gainesville, FL (US)

(72) Inventors: Shuo Wang, Gainesville, FL (US); Boyi Zhang, Gainesville, FL (US); Yanwen Lai, Zhuhai (CN)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 325 days.

(21) Appl. No.: 15/909,559

(22) Filed: Mar. 1, 2018

(65) Prior Publication Data
US 2018/0277299 A1    Sep. 27, 2018

Related U.S. Application Data

(60) Provisional application No. 62/475,968, filed on Mar. 24, 2017.

(51) Int. Cl.
*H01F 27/28* (2006.01)
*H03H 1/00* (2006.01)
*H01F 27/24* (2006.01)
*H01F 3/10* (2006.01)
*H01F 17/06* (2006.01)

(52) U.S. Cl.
CPC ........... *H01F 27/2823* (2013.01); *H01F 3/10* (2013.01); *H01F 17/062* (2013.01); *H01F 27/24* (2013.01); *H03H 1/00* (2013.01); *H01F 2003/106* (2013.01); *H03H 1/0007* (2013.01); *H03H 2001/005* (2013.01); *H03H 2001/0092* (2013.01)

(58) Field of Classification Search
USPC ................................ 336/188, 212, 219, 229
See application file for complete search history.

(56) References Cited

U.S. PATENT DOCUMENTS

| | | | | |
|---|---|---|---|---|
| 3,143,720 A | * | 8/1964 | Rogers | H01F 36/00 336/155 |
| 3,473,091 A | * | 10/1969 | McDonald | H02H 3/17 361/45 |
| 4,118,597 A | * | 10/1978 | Proctor | H04M 3/2272 324/117 R |

(Continued)

OTHER PUBLICATIONS

Wang et al., "Developing parasitic cancellation technologies to improve EMI filter performance for switching mode power supplies," IEEE Transactions on Electromagnetic Compatibility, Nov. 2005, pp. 921-929, vol. 47, No. 4.

(Continued)

*Primary Examiner* — Shawki S Ismail
*Assistant Examiner* — Kazi S Hossain
(74) *Attorney, Agent, or Firm* — Alston & Bird LLP

(57) ABSTRACT

Inductor designs and methods are provided. An inductor can include a first core and a second core. The first core can be larger than the second core and the second core can be seated within the inner diameter of the first core. A first and a second wire can be provided that each wrap around the first core and the second core. The first core can have less windings than the second core.

18 Claims, 32 Drawing Sheets

(56) References Cited

U.S. PATENT DOCUMENTS

| | | | | |
|---|---|---|---|---|
| 4,205,288 | A * | 5/1980 | Lin | H01F 27/245 336/212 |
| 5,581,224 | A * | 12/1996 | Yamaguchi | H01F 3/10 333/185 |
| 5,929,738 | A * | 7/1999 | Orlando | H01F 19/04 336/12 |
| 2004/0085176 | A1* | 5/2004 | Werlau | H03H 7/42 336/229 |
| 2006/0186981 | A1* | 8/2006 | Jang | H01F 30/06 336/215 |
| 2007/0040644 | A1* | 2/2007 | Jang | H01F 30/06 336/215 |

OTHER PUBLICATIONS

Wang et al., "Design of inductor winding capacitance cancellation for EMI suppression," IEEE Transactions on Power Electronics, Nov. 2006, pp. 1-7.

Chu et al., "A common mode inductor with external magnetic field immunity, low-magnetic field emission, and high-differential mode inductance," IEEE Transactions on Power Electronics, Dec. 2015, pp. 6684-6694, vol. 30, No. 12.

Chu et al., "EMI reduction with near field coupling suppression techniques for planar transformers and CM chokes in switching-mode power converters," IEEE Energy Conversion Congress and Exposition, Sep. 2013, pp. 3679-3686.

Van Hoang et al., "Near magnetic field coupling prediction using equivalent spherical harmonic sources," IEEE Transactions on Electromagnetic Compatibility, Dec. 2014, pp. 1457-1465, vol. 56, No. 6.

Wang et al., "Influence of high-frequency near-field coupling between magnetic components on EMI filter design," Twenty-Eighth Annual IEEE Applied Power Electronics Conference and Exposition, Mar. 2013, pp. 1500-1507.

Yang et al., "Analysis on near-field effect caused by stray magnetic field of integrated LLC transformer," 2014 International Power Electronics and Application Conference and Exposition, Nov. 2014, pp. 1-4.

Tan et al., "A common-mode choke using toroid-EQ mixed structure," IEEE Transactions on Power Electronics, Jan. 2013, pp. 31-35, vol. 28, No. 1.

Nave, "On modeling the common mode inductor," IEEE International Symposium on Electromagnetic Compatibility, Aug. 1991, pp. 452-457.

Zhang et al., "Analysis and reduction of the near magnetic field radiation from magnetic inductors," IEEE Applied Power Electronics Conference and Exposition, Mar. 2017, pp. 1-8.

Wang et al., "Using scattering parameters to characterize EMI filters," 35th Annual IEEE Power Electronics Specialists Conference, Jun. 2004, pp. 297-303.

Wang et al., "Common mode noise reduction for boost converters using general balance technique," IEEE Transactions on Power Electronics, Jul. 2007, pp. 1410-1416, vol. 22, No. 4.

Zhang et al., "Integrated common mode and differential mode inductors with low near magnetic field emission," IEEE Energy Conversion Congress and Exposition, Oct. 2017, pp. 5375-5382.

Zhang et al., "Winding and air gap configurations for power inductors to reduce near magnetic field emission," IEEE Energy Conversion Congress and Exposition, Oct. 2017, pp. 903-910.

Lee et al., "An integrated power electronics modular approach: concept and implementation," The 4th International Power Electronics and Motion Control Conference, Aug. 2004, pp. 1-13.

Chen, "Inductor design for common-mode and differential mode inductors," Thesis Presented to the Graduate Faculty of the University of Texas at San Antonio, Dec. 2014, pp. 1-62.

Wang et al., "Effects of parasitic parameters on EMI filter performance," IEEE Transactions on Power Electronics, May 2004, pp. 869-877, vol. 19, No. 3.

Labarre et al., "Circuit analysis of an EMI filter for the prediction of its magnetic near-field emissions," IEEE Transactions on Electromagnetic Compatibility, Apr. 2012, pp. 290-298, vol. 54, No. 2.

Lai et al., "An integrated EMI choke for differential-mode and common-mode noise suppression," IEEE Transactions an Power Electronics, Mar. 2010, pp. 539-544, vol. 25, No. 3.

Wang et al., "Inductor winding capacitance cancellation using mutual capacitance concept for noise reduction application," IEEE Transactions on Electromagnetic Compatibility, May 2006, pp. 311-318, vol. 48, No. 2.

Wang et al., "Cancellation of capacitor parasitic parameters for noise reduction application," IEEE Transactions on Power Electronics, Jul. 2006, pp. 1125-1132, vol. 21, No. 4.

Silva et al., "High gain DC-DC boost converter with a coupling inductor," Brazilian Power Electronics Conference, Sep. 2009, pp. 1-7.

Wilcox et al., "Calculation of self and mutual impedances for coils on ferromagnetic cores," IEE Proceedings A, Sep. 1988, pp. 470-476, vol. 135, No. 7.

* cited by examiner

Inductor (b)　　　　　　　　Inductor (d)

(a) (b)

(a) (b)

Inductor (e)   Inductor (f)   Inductor (g)

(a)   (b)

(a)

(b)          (c)          (d)

(e)          (f)          (g)

(a)

(b)

(a)

(b)

INDUCTOR DESIGNS FOR REDUCING MAGNETIC INTERFERENCE

CROSS-REFERENCE TO RELATED APPLICATION

This application claims the benefit of U.S. Provisional Application Ser. No. 62/475,968, filed Mar. 24, 2017, which is incorporated herein by reference in its entirety, including any figures, tables, and drawings.

STATEMENT OF GOVERNMENT SUPPORT

This invention was made with government support under grant number 1540118 awarded by the National Science Foundation. The government has certain rights in the invention.

BACKGROUND

As power electronic systems continue to develop, the density of their components has increased. This has increased problems related to near magnetic field coupling between components.

BRIEF SUMMARY

Embodiments of the present invention include novel inductor designs, fabrication methods, and design techniques. Novel common mode (CM) inductor structures are proposed that can greatly reduce near magnetic field radiation, increase leakage inductance, and improve high frequency performance. Differential mode (DM) inductance can also be increased, which is helpful for attenuating DM noise. Inductors of embodiments of the present invention can be used in, for example, single phase, three-phase or multi-phase power electronics systems.

Embodiments of the present invention include CM inductors with reduced near magnetic fields as well as reduced noise. The cost of attenuating noise can also be reduced. CM inductors of embodiments of the present invention can have an increased DM inductance, which provides better DM noise attenuation. The size of DM inductors can also be reduced and power density can be increased. CM inductors of embodiments of the present invention can have higher impedance in the high frequency range.

Embodiments of the present invention can be used to produce electromagnetic interference (EMI) filters. Compared to conventional EMI filters, EMI filters of embodiments of the present invention can attenuate CM noise at much higher frequencies with less magnetic field emissions. Assuming a fixed size, EMI filters of embodiments of the present invention can have much higher DM inductance with a greater ability to attenuate DM noise in comparison to conventional EMI filters.

DETAILED DESCRIPTION

Inductors are one of the most important passive components in power electronics systems. They can be used as energy storage devices in power converters/inverters including buck, boost and buck-boost power converters for energy conversion functions. Inductors can also be used as filters to reduce electromagnetic interference (EMI) generated in power electronics systems.

Inductor winding structures can be categorized as single-ended structures and balanced structures. In single ended inductors, there is only one winding on the core. In balanced winding structures, there are two, three or more identical windings on the core. Based on the current direction in the inductor windings, inductors can be categorized as DM and CM inductors. If the inductor has only one winding, it could be either a DM or a CM inductor depending on the current flowing through the winding. The windings of a two-winding DM inductor carry inverse currents with the same amplitude. The windings of a two-winding CM inductor carry current with the same direction and magnitude. The windings of a three-winding DM inductor carry current with a 120° phase shift and the same magnitude. The windings of a three-winding CM inductor carry currents with the same phase and magnitude.

Single winding and two-winding inductors will be the focus in explaining the concepts of embodiments of the present invention. However, the theory and techniques presented can be extended to three-winding and other multi-winding inductors.

Figure 1:
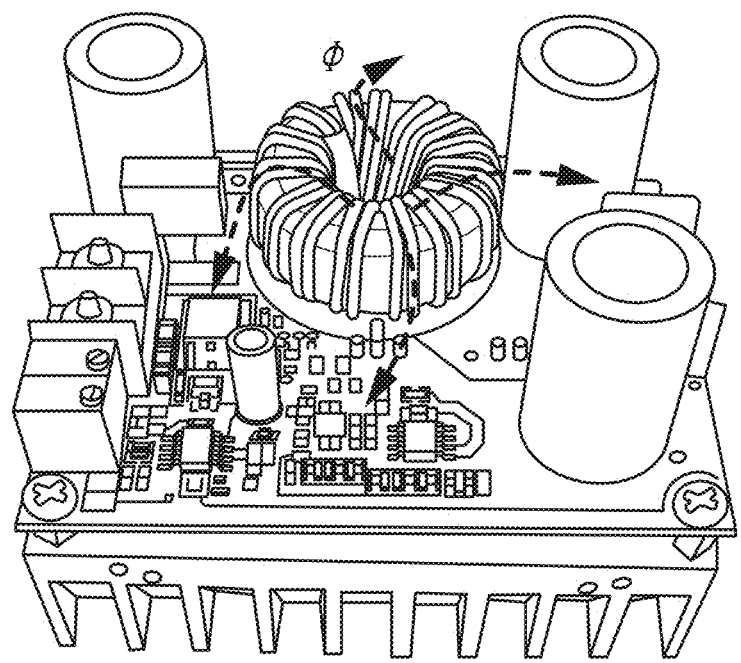
FIG. 1 shows an example of how a near magnetic field generated by an inductor can be detrimental to normal circuit operations.

When current flows through the windings of an inductor, most of the magnetic flux will flow through inductor's high permeability core due to its low magnetic reluctance. However, a small part of the magnetic flux will be emitted into the air and can contaminate other components or circuits nearby. FIG. 1 shows how radiated near magnetic field from an inductor can contaminate components and circuits in a power converter. This can destabilize the power converter or degrade the EMI reduction measures used in the converter. Since the distance of these components or circuits to the inductor is within 1/20 of the wavelength of the magnetic waves emitted from the inductor to the air, the characteristics of the near magnetic field are critical.

Figure 2:
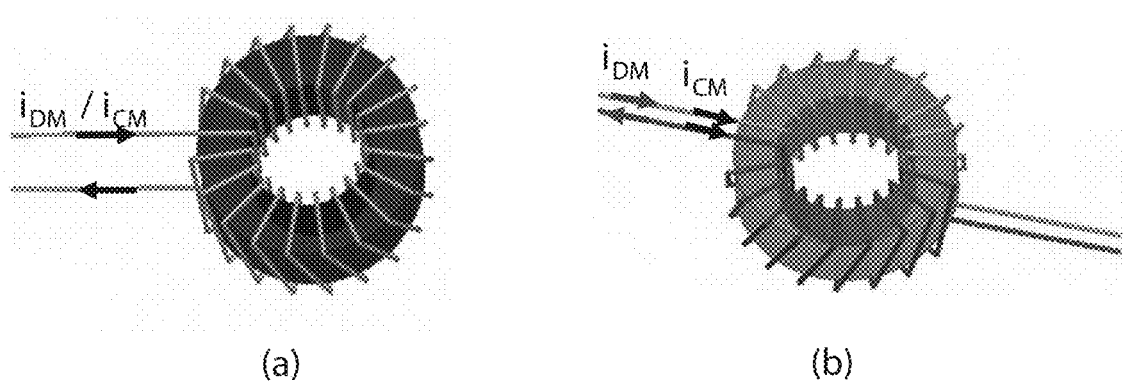
FIG. 2 shows conventional inductor structures having (a) a single-ended one winding inductor, and (b) a balanced two-winding inductor.
Figure 3:
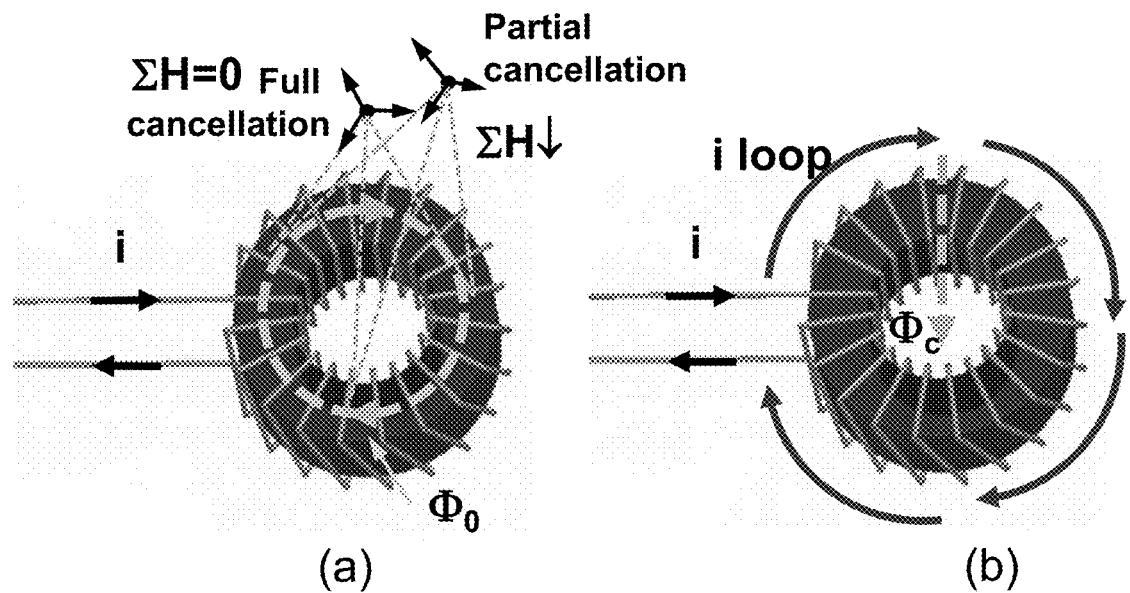
FIG. 3 shows the magnetic field of a single-ended inductor (a) directly generated by the winding turns, and (b) generated by the equivalent current loop.

FIG. 2 shows two conventional inductor structures, a single-ended one winding inductor and a balanced two-winding inductor. As shown, they can carry either DM or CM current. For the single-ended one winding structure in FIG. 2 (a), the core usually has a much higher permeability as a CM inductor than that of a DM inductor, although their permeability is much higher than air. FIG. 3 (a) shows the analysis of the near magnetic field radiation for a single-ended one winding inductor. There are two major magnetic fields generated by the inductor, the magnetic field $\Phi_0$ directly generated by the winding turns and the magnetic field $\Phi_C$ generated by the equivalent current loop along the toroidal core as shown in FIG. 3.

Most of $\Phi_0$ is confined within the magnetic core due to its high permeability. There is a very small portion of $\Phi_0$ in the air. This small portion tends to cancel itself as the vector sum of the H field generated by each winding turn as shown in FIG. 3 (a). This cancellation is due to the fact that the winding turns are evenly distributed along the toroidal core in 360°. As a result, the H field in the space fully cancels on the center line of the core and partially cancels in the space off the center line.

Figure 4:
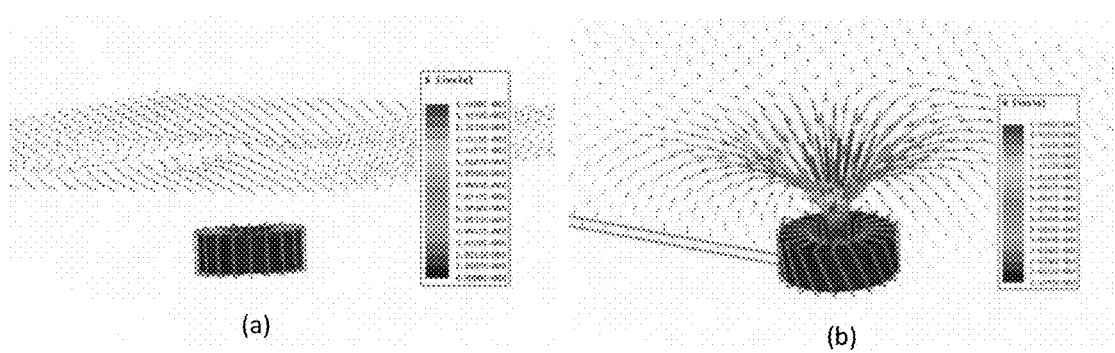
FIG. 4 shows the simulated near magnetic field of a single ended one-winding inductor generated by (a) winding turns, and (b) the equivalent current loop.

On the other hand, all of the $\Phi_C$ is radiated to the air as shown in FIG. 3 (b). The magnetic flux density reaches the highest at the center of the core. Because of this, it is expected that $\Phi_C$ will be dominant in the radiated near magnetic field of this inductor. FIG. 4 shows a simulated near magnetic field distribution, which supports the preceding analysis. As shown, the near magnetic field generated by the equivalent current loop has much higher magnetic field density than that generated by the winding turns. $\Phi_C$ on the bottom of the inductor is not shown in FIG. 4 (b), but its distribution is same as the top. Because $\Phi_C$ is dominant, using a toroidal inductor with a smaller inner radius can reduce the radiated near magnetic field.

Figure 5:
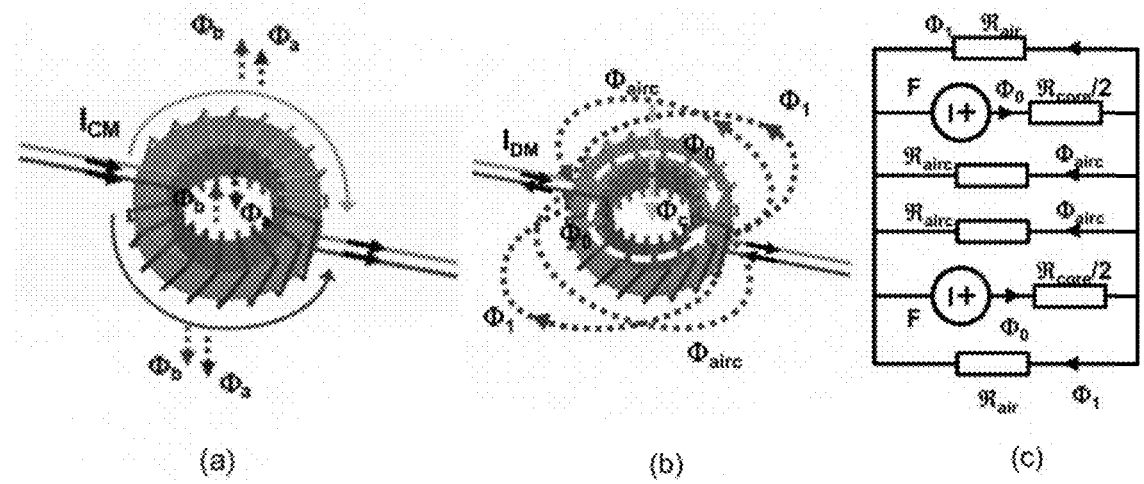
FIG. 5 shows the near magnetic field of a balanced two-winding inductor (a) excited with CM current and (b) excited with DM current, as well as (c) a magnetic reluctance model with DM excitations.

The balanced two-winding inductor in FIG. 2 (b) is often used in EMI filters to attenuate both CM and DM noise. For this application, two windings are directly coupled for CM currents but inversely coupled for DM currents. The inductor usually has a core with high permeability so it has high CM impedance to attenuate CM noise as the magnetic field generated by the two windings enhance inside the core. When carrying CM currents, the near magnetic field generated by t h e winding turns is very small due for the same reasons as discussed in regard to FIG. 3 (a). FIG. 5 (a) shows the near magnetic field generated by two equivalent current paths. $\Phi_a$ is the near magnetic field generated by the top path and $\Phi_b$ is the near magnetic field generated by the bottom path. Most of the near magnetic field is canceled between the two current paths and the near magnetic field is enhanced on both sides of the two current paths because the near magnetic field generated by the two current paths has the same direction on both sides. The near magnetic field is also determined by the returning current paths which are related to the circuit layout. Although the major near magnetic field radiation is caused by these two equivalent current paths for this winding structure with CM current excitations, if the circuit layout can be properly designed to minimize the loop areas, it would be much reduced. In summary, this near magnetic field can be small as it is equivalent to the near magnetic field generated by two equivalent current paths and their returning paths in FIG. 5 (a).

On the other hand, the leakage inductance of the two windings can be used as the DM inductance to attenuate DM noise. When the inductor carries DM current, the magnetic field generated by the two windings mostly cancel inside the core, so most of the magnetic field generated by the DM current is radiated to the air. However, since the DM currents include power currents, the radiated near magnetic field could be much stronger than that from the CM currents.

FIGS. 5 (b) and (c) show the analysis of the near magnetic field radiation from a balanced two-winding inductor when carrying DM currents in its two windings. In FIGS. 5 (b) and (c), the magnetic flux flowing within the core is $\Phi_0$. The magnetic flux flowing on the top and bottom sides of the core within the air between the two windings opening is $\Phi_{airC}$. The magnetic flux flowing on the front and back sides of the core within the air between the two winding opening is $\Phi_1$, $\mathfrak{R}_{air}$ and $\mathfrak{R}_{airC}$ are the equivalent reluctances of the air on the two sides and on the top or bottom sides. $\mathfrak{R}_{core}$ the equivalent reluctance of the magnetic core. F is the magnetomotive force (MMF) generated by each winding. The reluctances meet the following conditions:

$$\frac{\mathfrak{R}_{core}}{2} << \frac{\mathfrak{R}_{air}}{2}, \frac{\mathfrak{R}_{airC}}{2} \tag{1}$$

The $\Phi_0$ can be solved in (2), $$\Phi_0 = \frac{\left[\frac{\mathfrak{R}_{core}}{2} - \left(\frac{\mathfrak{R}_{core}}{2} // \frac{\mathfrak{R}_{air}}{2} // \frac{\mathfrak{R}_{airC}}{2}\right)\right]F}{\left[\frac{\mathfrak{R}_{core}}{2} // \frac{\mathfrak{R}_{air}}{2} // \frac{\mathfrak{R}_{airC}}{2} + \frac{\mathfrak{R}_{core}}{2}\right] \cdot \frac{\mathfrak{R}_{core}}{2}} \tag{2}$$

In (2), the $\Phi_0$ is small because the numerator is small due to the fact that $\mathfrak{R}_{air}$ and $\mathfrak{R}_{airC}$ are much bigger than $\mathfrak{R}_{core}$. The magnetic field generated by the two windings mostly cancels out.

The $\Phi_1$ and $\Phi_{airC}$ can be solved in (3), $$2(\Phi_1 + \Phi_{airC}) \approx 2F\left(\frac{1}{\mathfrak{R}_{air}} + \frac{1}{\mathfrak{R}_{airC}}\right) \tag{3}$$

In (3), $2(\Phi_1+\Phi_{airC})$ represents the total radiated near magnetic field, which is twice that of the radiated magnetic field of a single winding. $\Phi_1$ is determined by $F/\mathfrak{R}_{air}$ and $\Phi^{airC}$ is determined by $F/\mathfrak{R}_{airC}$.

In FIG. 5 (b), $\Phi_C$ is generated by the DM current loop similar to that in FIG. 3 (b). Compared with $2(\Phi_1+\Phi_{airC})$, it is small due to the fact that the DM loop current has only one turn but $2(\Phi_1+\Phi_{airC})$ represents almost all the magnetic flux of the DM inductance.

The magnetic flux of the leakage DM inductance of the CM inductor is mostly $2(\Phi_1+\Phi_{airC})$ because magnetic flux is low inside the core as shown in (2). Because $2(\Phi_1+\Phi_{airC})$ is generated by DM current $I_{DM}$, the DM inductance $L_{DM}$ of the CM inductor is therefore, $$L_{DM} = \frac{2(\Phi_1 + \Phi_{airC})}{I_{DM}} \quad (4)$$

Figure 6:
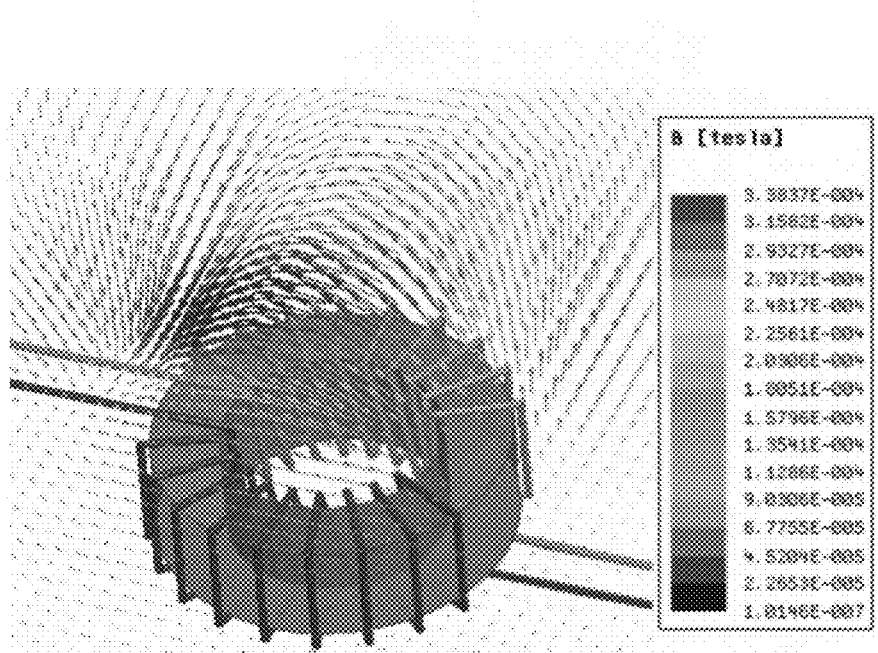
FIG. 6 shows the simulated near magnetic field of a balanced two-winding inductor with a DM current excitation.

It is shown in FIG. 6 that the $2(\Phi_1+\Phi_{airC})$ is a major source of near magnetic field radiation for this winding structure. It is much higher than $\Phi_C$. The winding structure in FIG. 2 (b) with two windings directly coupled for DM currents will be analyzed below.

Figure 7:
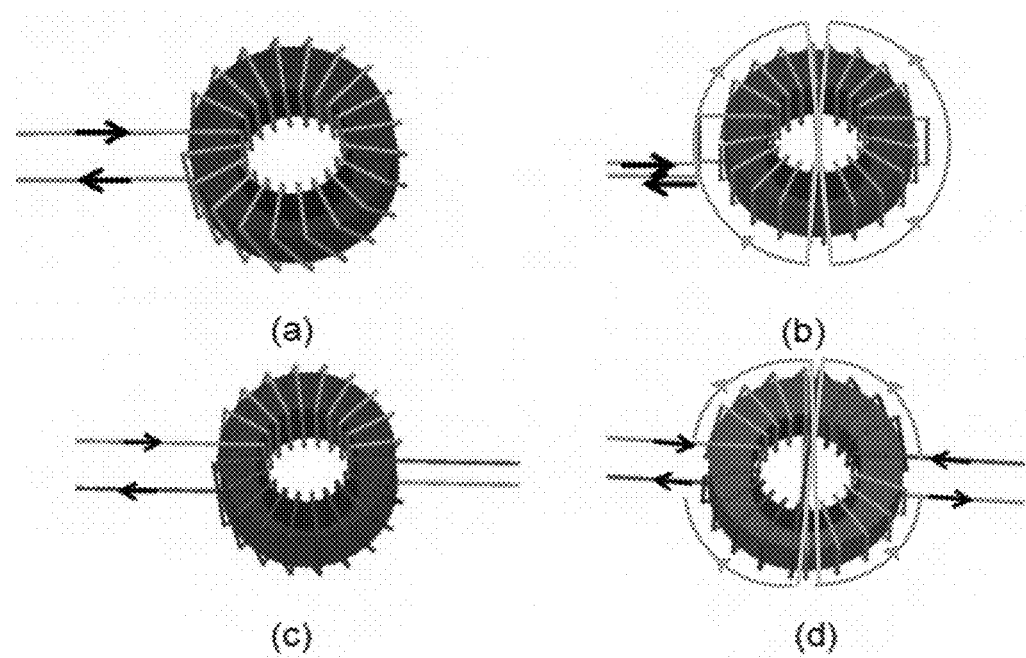
FIG. 7 shows DM inductors with different winding structures.

FIG. 7 shows four winding structures for DM inductors. Structure (a) is the same as the single-ended one winding structure in FIG. 2 (a). Structure (b) is still a single-ended structure but has a winding cross at the ¼ and ¾ winding locations. As a result, half of the current loop has an inverse direction relative to the other half, as shown by the arrow lines. Structure (c) is a balanced two-winding structure with two windings directly coupled for DM currents. From a magnetic field point of view, it is similar to winding structure (a). Structure (d) is also a balanced two-winding structure with two windings directly coupled for DM currents. However, the two windings have a winding cross in the center of each winding and, as a result, structure (d) has a similar current loop to that of structure (b). Relative to the position of the two input terminals, the two output terminals of structure (d) have switch positions.

Because structures (a) and (c) of FIG. 7 have a similar near magnetic field distribution to that of FIG. 2 (b), their magnetic field distribution will not be discussed. It has been analyzed in FIG. 3 that the H field generated by each winding turn tends to cancel each other in so the radiated near magnetic field is small. On the other hand, the $\Phi_C$ generated by the equivalent current loop is dominant in the near magnetic field. For structures (b) and (d), the equivalent current loop is twisted in the center, so there are two small current loops with reversed current directions. The magnetic fields generated by these two loops have inverse directions so their magnetic field distributions are more complicated than the other structures.

Figure 8:
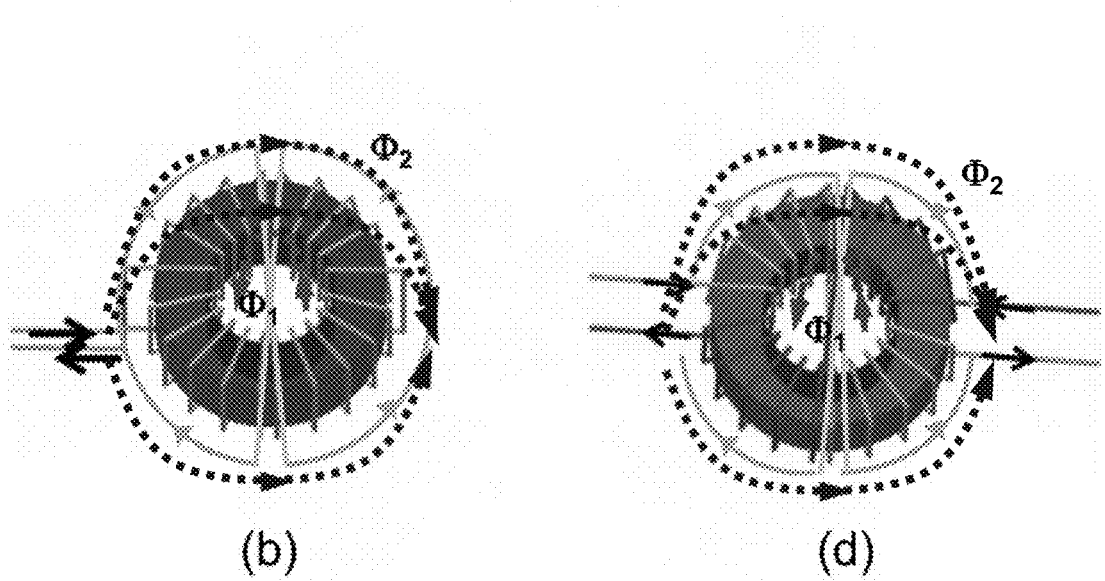
FIG. 8 shows the near magnetic field distribution of DM inductor winding structures (b) and (d).

In FIG. 8, when two adjacent equivalent current loops carry inverse current, they generate inverse magnetic fields with the same magnitude. The generated magnetic fields tend to cancel each other in the space. Because of this, the near magnetic field is smaller than that from structure (a) and (c). For the space close to the inductor, as shown in FIG. 8, the inner magnetic flux $\Phi_1$ flows through a loop between two current loops and it has an inversed direction relative to the outer magnetic flux $\Phi_2$'s loop which passes through the two equivalent current loops from the other sides. This is due to the fact that the current loop generates magnetic flux both inside and outside of the current loop and they have inverse directions because all fluxes always follow the loops. Only the top half of the magnetic flux loops is shown in FIG. 8. The bottom half is the same as the top half except the flux direction is reversed. As analyzed above, inductors (b) and (d) should have a similar near magnetic field distribution.

Figure 9:
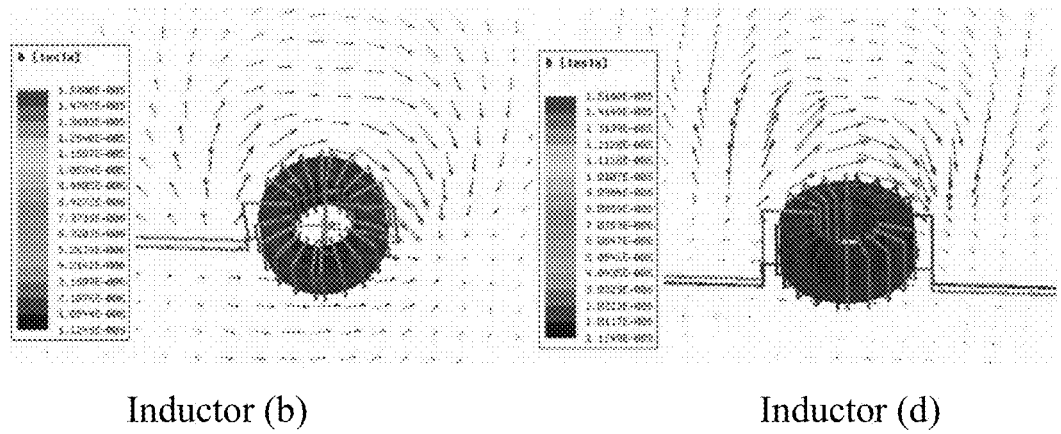
FIG. 9 shows simulated magnetic fields for inductor winding structures of FIGS. 8(b) and 8(d).

FIG. 9 shows the simulated near magnetic field for structures (b) and (d). Only the magnetic flux on outer loop is shown in FIG. 9 as the observing plane is above the inner magnetic flux loop. These results verify the analysis above.

Figure 10:
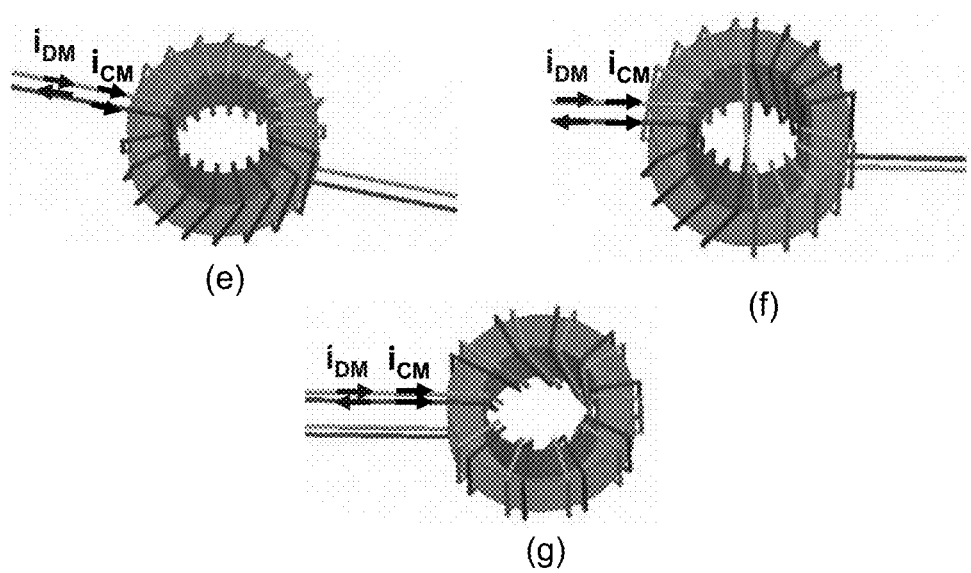
FIG. 10 shows three CM inductors with different winding structures.

FIG. 10 shows three winding structures for CM inductors. Inductor winding structure (e) is a regular CM inductor. Each winding of the two windings on inductor winding structure (f) is split into two halves. The four winding halves have a cross in the middle. The two windings on inductor winding structure (g) are bifilar. Because the leakage inductance of CM inductors is usually used for DM noise reduction, all of these three inductor winding structures will be analyzed for both CM and DM current excitations. The near magnetic field radiation of inductor winding structure (e) with DM or CM currents has been analyzed in FIG. 2 (b).

Figure 11:
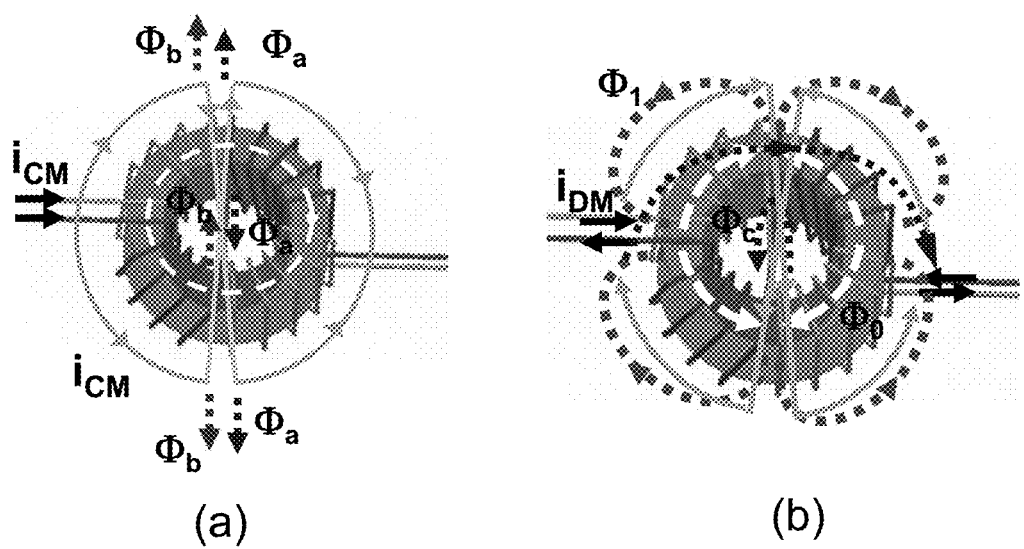
FIG. 11 shows the near magnetic field of FIG. 10(f) with (a) CM currents and (b) DM currents.

Inductor winding structure (f) of FIG. 10 has four winding halves along the core and each has a 90° span. Because all winding turns are equivalent to those of a regular CM inductor, when the two windings conduct CM currents, the near magnetic field generated by winding turns is similar to that in FIG. 3 (a). The near magnetic field generated by equivalent current paths is shown in FIG. 11 (a), which is similar to that in FIG. 5 (a), as the near magnetic fields generated by two cross segments cancel since they carry inverse currents.

When the two windings conduct DM currents, the near magnetic field generated by winding turns can still be analyzed similar to that of FIGS. 5 (b) and (c). The difference is each winding spans 90° instead of 180°, and as a result the leakage flux generated by these four winding halves also span 90° as shown by (Di in FIG. 11 (b). Because four winding halves are interleaved along the core, the coupling between the two windings is better than that of the conventional inductor winding structure (e). Therefore, the radiated near magnetic field is smaller than that of structure (e). As a result, its leakage (DM) inductance is also smaller than conventional winding structure (e). Because of this, winding structure (f) sacrifices DM inductance to reduce near magnetic field radiation. It is therefore preferred when a reduced near magnetic field is desired and reduced DM inductance is acceptable. There are two equivalent current loops with reverse current directions in the winding structure shown in FIG. 11 (b). Similar to winding structure (d) with DM current excitation, the near magnetic field generated by these two current loops can be represented similarly with the magnetic field distribution of inductor winding structure (d) in FIG. 8. It is shown by the blue dash lines in FIG. 11 (b). For the same reason as for FIGS. 5 (b) and (c), the near magnetic field generated by the winding turns is small enough that it can be ignored.

The inductor winding structure (g) has the smallest near magnetic field radiation with DM current excitations. This is because the magnetic field generated by the two bifilar windings cancel each other as they have the same magnitude and almost the same position, but with inverse currents. The near field radiation due to CM currents is similar to that of FIG. 4 for the inductor in FIG. 2 and both of these two near magnetic field radiations are small. The disadvantage of this structure is the leakage (DM) inductance is small so it cannot be used to attenuate DM noise.

Figure 12:
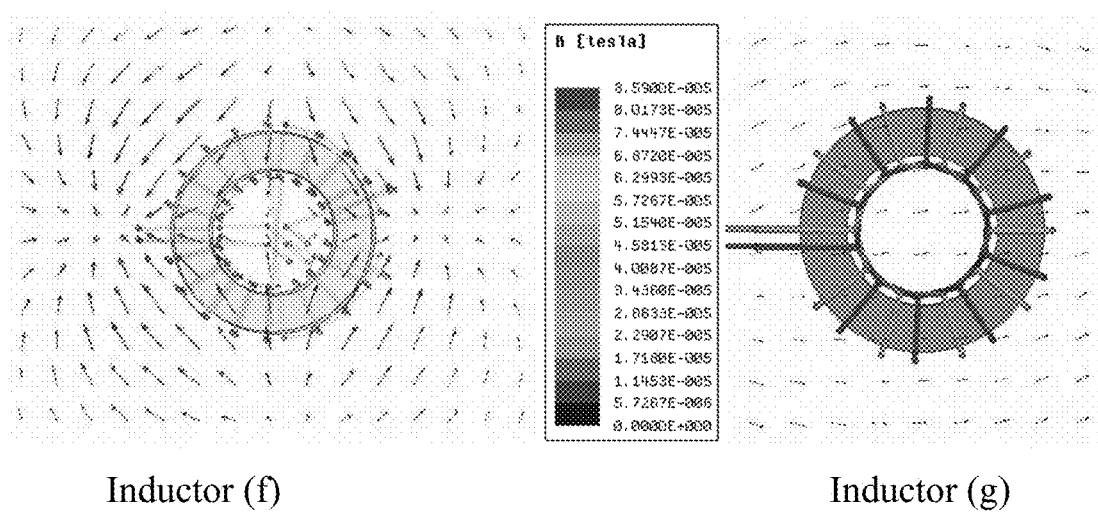
FIG. 12 shows simulated near magnetic fields of inductor (f) and (g) with DM excitations.

Simulation results for inductor structure (f) and (g) with DM excitations are shown in FIG. 12 under the same conditions applied with regard to FIG. 6, which validates the above analysis. The near magnetic flux spans 90° as analyzed above, and structure (g) has a much smaller near magnetic field radiation than structure (f).

Although the winding structures of inductor (f) and (g) can reduce the near field radiation, the DM inductance, especially of structure (g), is greatly reduced, which is not desirable.

Figure 13:
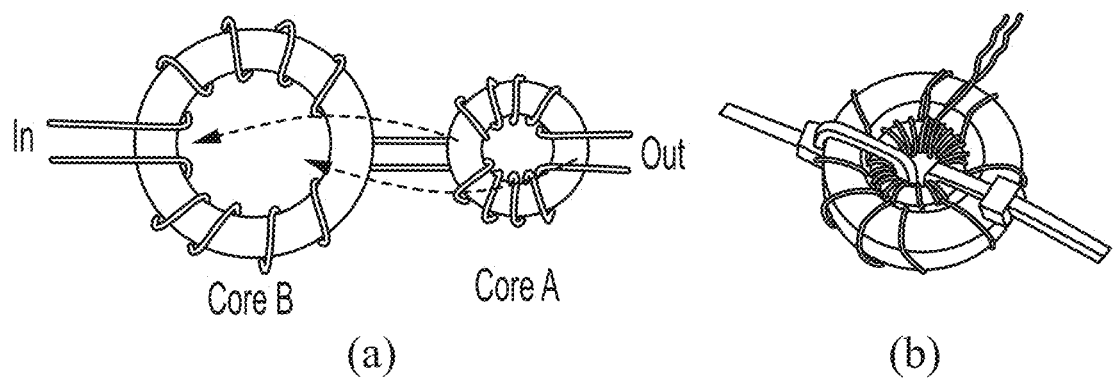
FIG. 13 shows a CM inductor (a) winding connection and (b) a prototype according to an embodiment of the present invention.

Embodiments of the present invention include novel CM inductor structures that can greatly reduce near magnetic field radiation and increase DM inductance at the same time. A CM inductor of embodiments of the present invention can include two cores, core A and core B, as shown in FIG. 13. Core A can be smaller than core B and positioned within core B. The winding connections between these two cores are shown in FIG. 13 (a). A prototype is shown in FIG. 13 (b).

Figure 14:
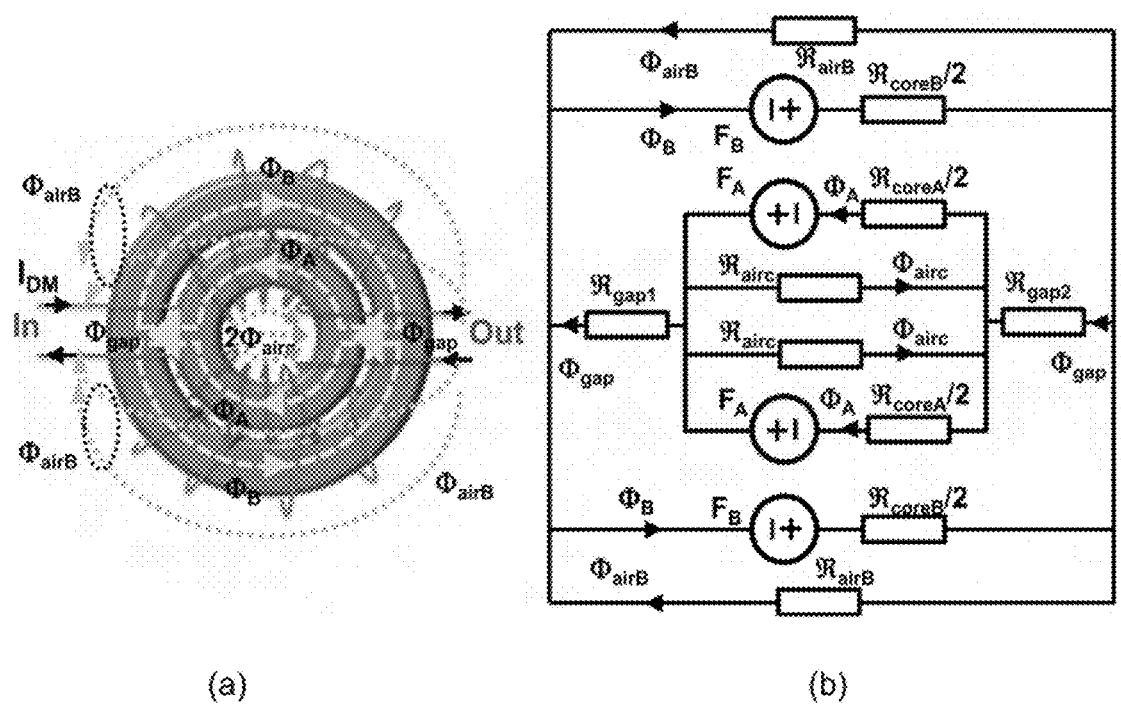
FIG. 14 shows (a) a CM inductor according to an embodiment of the present invention and its magnetic flux, and (b) a representative magnetic circuit.

The top view of a CM inductor according to embodiments of the present invention and its equivalent magnetic circuit with DM current excitations are shown in FIG. 14. Similar to other inductors, the near magnetic field radiation of the proposed CM inductors with CM current excitation is much less than that with DM excitations, so only DM current excitation will be analyzed below.

In FIG. 14, it is assumed that the inductor structure is fully symmetric to a horizontal center line, so all the reluctances and magnetic fluxes are equal for the top and bottom. $\mathfrak{R}_{coreA}$ and $\mathfrak{R}_{coreB}$ represent the magnetic reluctance of core A and core B, respectively. $\Phi_A$ and $\Phi_B$ represent the magnetic fluxes flowing through $\mathfrak{R}_{coreA}$ and $\mathfrak{R}_{coreB}$, respectively. $\mathfrak{R}_{airC}$ represents the reluctance of the air across the two winding openings on core A. $\Phi_{airC}$ represents the magnetic fluxes flowing through $\mathfrak{R}_{airC}$, which is part of the near magnetic field radiation of the inductor. $\mathfrak{R}_{airB}$ represents the magnetic reluctance of the air between two winding openings on core B in FIG. 14 (a). $\Phi_{airB}$ represents the magnetic fluxes flowing through $\mathfrak{R}_{airB}$. The flux flows from one winding opening in a 360° direction to another winding opening, which is part of the near magnetic field radiation of the inductor. $2\Phi_{airB}$ and $2\Phi_{airC}$ represent all of the near magnetic field radiated from the proposed CM inductor with DM current excitations. $\mathfrak{R}_{gap1}$ and $\mathfrak{R}_{gap2}$ represent the equivalent magnetic reluctance of the air gaps between core A and core B on each side. $\Phi_{gap}$ represents the magnetic flux flowing through $\mathfrak{R}_{gap1}$ and $\mathfrak{R}_{gap2}$, $F_A$ and $F_B$ represent the magnetomotive force generated by the windings on core A and core B, respectively.

Because $2\Phi_{airB}$ and $2\Phi_{airC}$ represent the near magnetic field radiated from the proposed CM inductor with DM current excitations, if $2\Phi_{airB}$ and $2\Phi_{airC}$ are greatly reduced, the near magnetic radiation is greatly reduced.

The reluctances meet the condition below:

$$\frac{\mathfrak{R}_{coreA}}{2}, \frac{\mathfrak{R}_{coreB}}{2} < \mathfrak{R}_{gap1}, \mathfrak{R}_{gap2} << \mathfrak{R}_{airB}, \mathfrak{R}_{airC} \quad (5)$$

If $\mathfrak{R}_{gap} = \mathfrak{R}_{gap1} + \mathfrak{R}_{gap2}$, based on (5). $2\Phi_{airB}$ is given as, $$2\Phi_{airB} \approx \frac{F_B\left(\frac{\mathfrak{R}_{coreA}}{4} + \mathfrak{R}_{gap}\right) - F_A \frac{\mathfrak{R}_{coreB}}{4}}{\left(\frac{\mathfrak{R}_{coreA}}{4} + \mathfrak{R}_{gap} + \frac{\mathfrak{R}_{coreB}}{4}\right) \frac{\mathfrak{R}_{airB}}{2}}. \quad (6)$$

$2\Phi_{airC}$ is given as, $$2\Phi_{airC} \approx \frac{F_A\left(\frac{\mathfrak{R}_{coreB}}{4} + \mathfrak{R}_{gap}\right) - F_A \frac{\mathfrak{R}_{coreA}}{4}}{\left(\frac{\mathfrak{R}_{coreA}}{4} + \mathfrak{R}_{gap} + \frac{\mathfrak{R}_{coreB}}{4}\right) \frac{\mathfrak{R}_{airC}}{2}}. \quad (7)$$

From (6), near magnetic field radiation $2\Phi_{airB}$ can be eliminated when condition (8) is met:

$$\frac{F_B}{F_A} = \frac{\mathfrak{R}_{coreB}}{4} / \left(\frac{\mathfrak{R}_{coreA}}{4} + \mathfrak{R}_{gap}\right) \quad (8)$$

Condition (8) indicates that $F_B$ should be smaller than $F_A$, which means a smaller number turns should be used for core B than core A. This results in a reduced magnetic flux density in core B. Furthermore, core B has a longer core length than core A, which also results in a reduced flux density in core B. Due to these factors, core B is not fully utilized and core B can use a magnetic material with higher permeability than core A so that a smaller number of turns can still fully utilize the maximum flux density. As shown in FIG. 14 (a), $2\Phi_{airB}$ is very important as it represents the near magnetic field radiated around the whole inductor.

From (7), near magnetic field radiation $2\Phi_{airC}$ can be eliminated when condition (9) is met:

$$\frac{F_B}{F_A} = \left(\frac{\mathfrak{R}_{coreB}}{4} + \mathfrak{R}_{gap}\right) / \frac{\mathfrak{R}_{coreA}}{4} \quad (9)$$

Condition (9) indicates that FA should be smaller than FB, which means smaller number turns can be used for core A than core B. This may contrast what is shown in condition (8); however, as shown in FIG. 14 (a), $2\Phi_{airC}$ represents the near magnetic field radiated across core A. From an EMI point of view, if there are no components or sensitive circuits close to the center of core A, $2\Phi_{airC}$ is unimportant.

As shown in FIG. 14 (a), $2\Phi_{airB}$ and $2\Phi_{airC}$ also partially cancel each other around the horizontal center line close to core A because they have inverse directions. Based on the analysis above, condition (8) can be met, at least approximately, to reduce near magnetic field radiation. The remaining near magnetic field can be further reduced by $2\Phi_{airC}$ in the space as analyzed above.

The near magnetic field $2\Phi_{airB}$ of the proposed CM inductor is much smaller than the near magnetic field $2\Phi_1$ of a conventional CM inductor in (3) is because the near magnetic field generated by $F_A$ cancels that generated by $F_B$ based on (6) and (8), and $2\Phi_{airB}$ and $2\Phi_{airC}$ partially cancel each other in space. It should be noted that $F_A$ or $F_B$ in (6) could be smaller than the F in (3) as both inductors can have the same total inductance for comparison.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

Materials and Methods

Design optimization processes were developed as an important part of embodiments of the present invention. To meet condition (8), the dimensions of the cores and the number of turns on each core need to be strategically designed. At the same time, the desired CM inductance must be reached, giving constraints:

$$\frac{N_B}{N_A} = \Re_{coreB} / (\Re_{coreA} + 4\Re_{gap}) \quad \text{(mm-1)}$$

and $$L = N^2_A/R_{coreA} + N^2_B/R_{coreB} \quad \text{(mm-2)}$$

In constraint (mm-1), the magnetic reluctance of core A is in series with four times the reluctance of the air gap. The reluctance of the air gap is much bigger than the reluctance of the core due to the high permeability of the magnetic core material. Thus, the reluctance of core A is not a significant influence. Therefore, in the optimization process, the variables are the permeability of core B and number of turns on core A. With two equations and two variables, the design can be optimized.

When designing inductors of embodiments of the present invention, core saturation should also be taken into consideration. Using equation (10), the maximum flux inside the cores can be calculated, and the dimensions of core A and core B should be chosen to ensure proper functionality. After calculating the optimized reluctance of core B, the effective length and area of core B can be adjusted to meet saturation requirements and also maintain the same ratio between effective length and area, so that the optimized reluctance does not change.

Example 1

Figure 15:
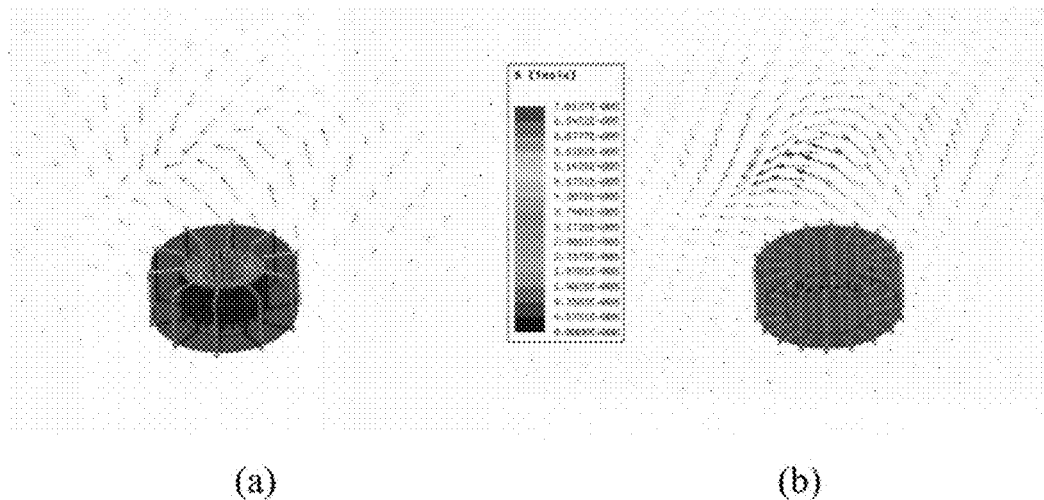
FIG. 15 shows simulated near magnetic field radiation on a 20 mm horizontal plane of (a) a CM inductor according to an embodiment of the present invention and (b) a conventional CM inductor.

Simulations were conducted to prove the concepts of embodiments of the present invention. FIG. 15 shows the simulated near magnetic field radiation of (b) a conventional CM inductor and (a) a CM inductor according to and embodiment of the present invention (or a "CM inductor embodiment"), each having 1.5 A DM current excitations. TABLE 1 lists the simulation conditions for both inductors.

TABLE 1

INDUCTOR INFORMATION FOR EXPERIMENTS AND SIMULATIONS

| | Outer Diameter | Inner Diameter | Height | Number of turns[1] | Initial relative permeability |
|---|---|---|---|---|---|
| Core A | 12.50 mm | 7.5 mm | 5.95 mm | 13 | 2200 |
| Core B | 26.67 mm | 14.23 mm | 11.02 mm | 5 | 5000 |
| Regular inductor | 26.67 mm | 14.23 mm | 11.02 mm | 8 | 5000 |

The inductors of FIG. 15 both have the same dimensions and the same CM inductance $L_{CM}$=340 μH. For the CM inductor embodiment, $L_{CM}$=$L_{CMA}$+$L_{CMB}$. It can be seen in FIG. 15 that the CM inductor embodiment (b) has much less near magnetic field radiation than the conventional CM inductor (a).

In FIG. 14, the DM magnetic flux that is generated by DM current $I_{DM}$ approximately meets the condition below:

$$2\Phi_A \approx \Phi_{gap} \approx 2\Phi_B \approx \frac{F_A + F_B}{\frac{R_{coreA}}{4} + R_{gap} + \frac{R_{coreB}}{4}} \quad (10)$$

The DM inductance is therefore:

$$L_{DM} = \frac{2N\Phi_A}{I_{DM}} \quad (11)$$

It is much larger than that in (4) of a conventional CM inductor because magnetic flux $2\Phi_A$ is much bigger than $2(\Phi_1+\Phi_{airC})$ in (3). The conventional CM inductor in FIG. 5 has a high reluctance $\Re_{air}//\Re_{airC}$ for DM magnetic flux, so DM inductance is small. The proposed CM inductor in FIG. 14 has a much smaller reluctance $\Re_{gap}+(\Re_{coreA}+\Re_{coreB})/4$ than $\Re_{air}/\Re_{airC}$, so its DM inductance is greater. The reason for this is the two cores and the small air gaps between provide small reluctance paths for DM magnetic flux. The DM inductances on the two cores are closely and directly coupled.

It is also shown in FIG. 14, (10) and (11) that the total air gap reluctance between the two cores is approximately constant when the total air gap length, which is the difference between the outer diameter of core A and the inner diameter of core B, is constant. This indicates that it is not necessary for core A to be in the center of core B. Therefore, the exact position of core A inside core B may not significantly affect DM inductance, which can be beneficial for inductor manufacturing.

Figure 16:
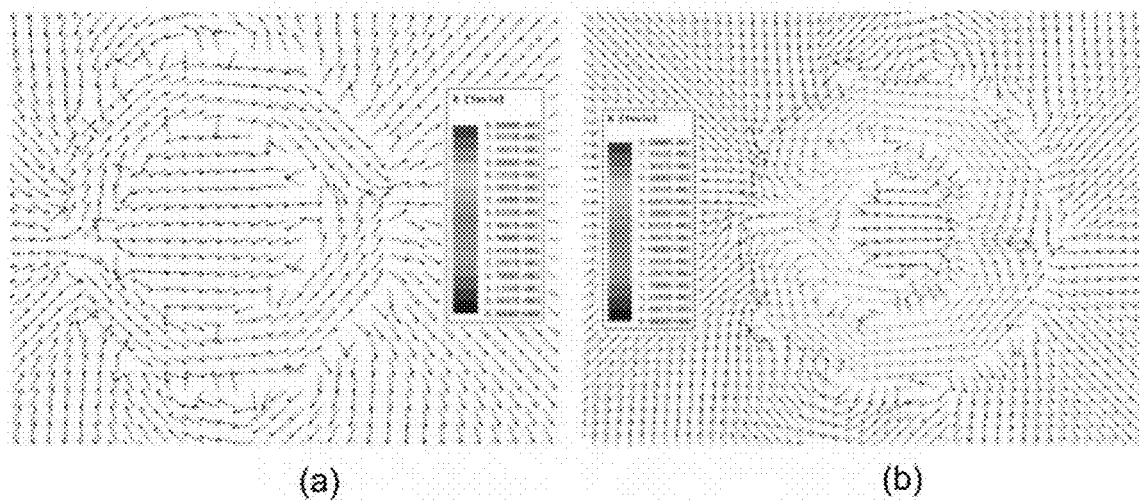
FIG. 16 shows simulated DM magnetic flux distributions on an XY-plane cutting the cores of (a) a conventional CM inductor, and (b) a CM inductor according to an embodiment of the present invention.

FIG. 16 shows the simulated magnetic flux distribution on an XY plane across the inductors for (a) a conventional CM inductor and (b) a CM inductor embodiment. The inductors have the same parameters as shown in TABLE I.

FIG. 16 demonstrates that the CM inductor embodiment had a much higher magnetic flux inside the cores and air gaps than the conventional inductor. The simulated flux distributions match the analysis in FIGS. 5 and 14. Specifically, the simulated DM inductance was 2.6 μH for the conventional CM inductor and 9.9 μH for CM embodiment (roughly 4 times of that of the conventional inductor).

Example 2

Experimental prototypes of DM inductors (a), (b), (c) and (d) of FIG. 7 were produced using powder cores with a relative permeability of 60. For each inductor, the inner diameter was 13.7 mm, the outer diameter was, 24.4 mm, the core height was 9.66 mm and there were a total 20 winding turns. All the measured DM inductances were close to 20 μH. CM inductors (e), (f) and (g) were created using ferrite cores with a relative permeability of 5000, an inner diameter of 13.7 mm, an outer diameter of 22.1 mm, and a core height of 6.35 mm. There were 10 number of turns in each winding. All the measured CM inductances were close to 200 μH. AWG #24 was used for the winding wires of all the inductors.

Figure 17:
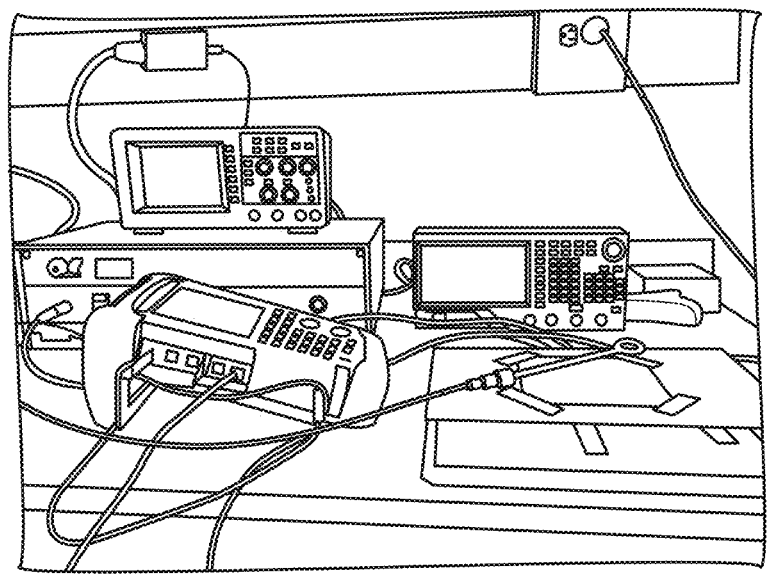
FIG. 17 shows an image of an experimental setup used to test prototypes of embodiments of the present invention.

A signal generator RIGOL DS 1052E, a Beehive Electronics 100-C EMC probe, a 25 W RF amplifier (Model 25A250A) and a Rohde & Schwarz FSH4 spectrum analyzer were used. The experiment set up is shown in FIG. 17. The inductors were placed under the center of a coordinated board. The distance between the coordinated board and the testing inductors was 20 mm and was adjusted to compensate for the radius of the EMC probe. A 150 kHz sinusoidal voltage signal was generated by the signal generator. It was amplified by the RF amplifier and connected to the inductor. A current probe was used to monitor the input DM current at 1.5 A. The coordinated board had 14×14=196 points on a 7.5 mm spaced grid. The EMC probe was connected to the spectrum analyzer and measured the magnetic field in three-dimensions. The measured data was converted into Teslas and the total magnetic flux density was calculated based on, $$B=\sqrt{B_x^2+B_y^2+B_z^2} \quad (12)$$

Figure 18:
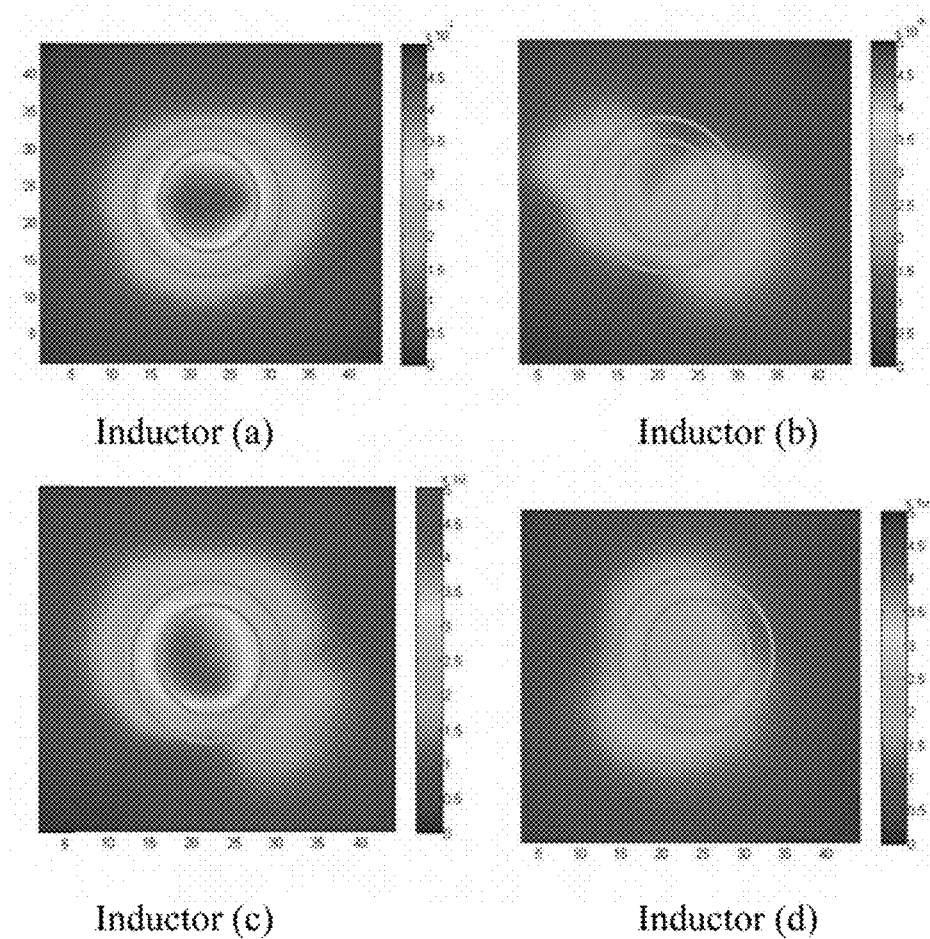
FIG. 18 shows the measured near magnetic field for DM inductors on a plane 20 mm above the inductors with DM current excitations.

The measured near magnetic fields for inductors (a), (b), (c) and (d) are shown in FIG. 18. As shown in FIG. 18, inductor (a) had a similar near magnetic field radiation to inductor (c), and inductor (b) had a similar near magnetic field radiation to inductor (d). The near magnetic field radiations of inductors (b) and (d) were much higher than those of inductors (a) and (c).

Figure 19:
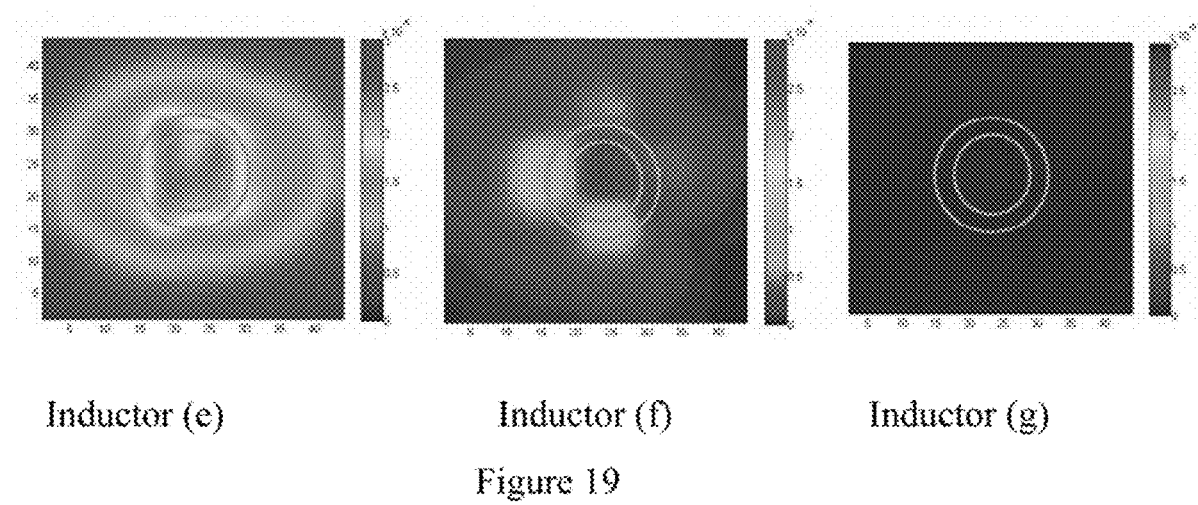
FIG. 19 shows measured near magnetic fields for CM inductors on a plane 20 mm above the inductors with DM current excitations.

The measured near magnetic fields for inductors (e), (f) and (g) are shown in FIG. 19. As shown in FIG. 19, inductor (e) had the highest near magnetic field radiation. The near magnetic field of inductor (f) was much smaller than that of inductor (e). Inductor (g) had the smallest near magnetic field radiation. The measured DM inductance for inductor (e), (f) and (g) was 1.46 µH, 0.64 µH and 0.18 µH, respectively.

Figure 20:
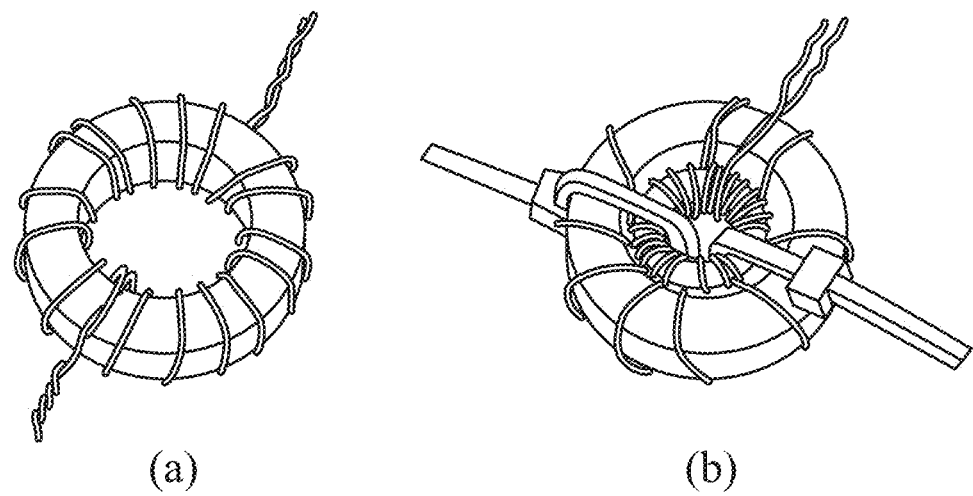
FIG. 20 shows prototypes of (a) a conventional CM inductor and (b) a CM inductor prototype.

To evaluate the near magnetic field radiation from a conventional CM inductor and a CM inductor embodiment, the prototypes of FIG. 20 were constructed. The inductors had the same parameters as listed in TABLE I. The wire used for the windings was AWG #24. The manufacturer of core B was Laird-Signal Integrity Products, with a core product number of 35T1000-00H. The manufacturer of core A was TDK, with a core product number of B64290L44X87.

Figure 21:
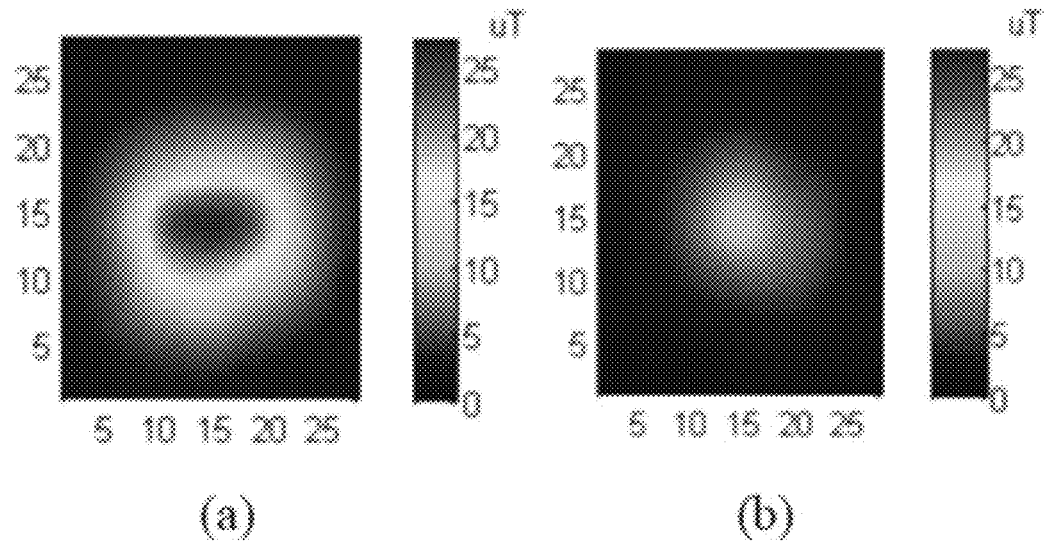
FIG. 21 shows measured near magnetic fields on a plane 25 mm above the inductors with DM current excitations in (a) a conventional CM inductor, and in (b) a CM inductor according to an embodiment of the present invention.

The measured near magnetic fields are shown in FIG. 21. Compared to the conventional CM inductor (a), the experimental prototype embodiment had reduced near magnetic field radiation by about 70%.

Figure 22:
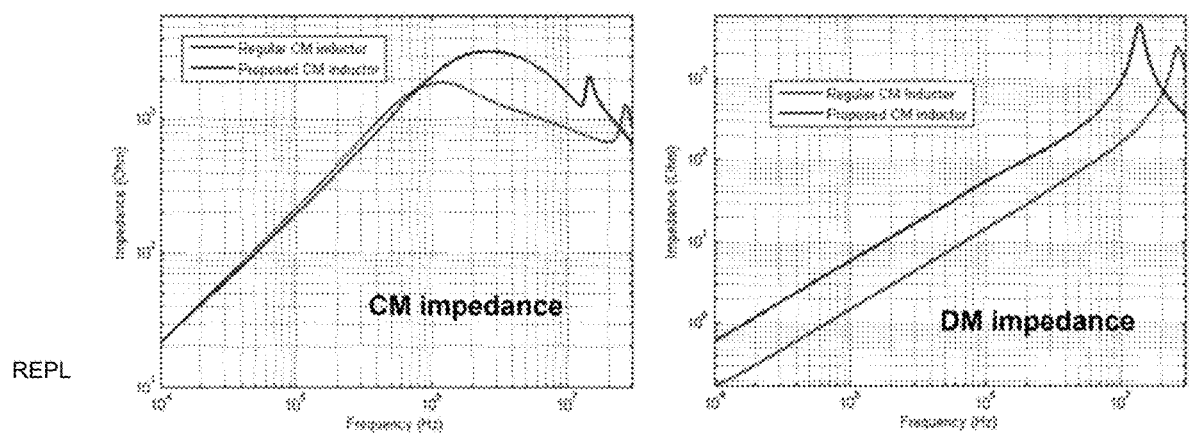
FIG. 22 shows measured CM and DM impedances for conventional CM inductors and CM inductors according to an embodiment of the present invention.

The measured CM impedances and DM impedances were compared as shown in FIG. 22. At low frequencies, both inductors had a CM inductance close to 40041. However, the CM inductor embodiment had a greater CM impedance than the conventional CM inductor at high frequencies because their high resonant frequencies were separated, resulting in a wider bandwidth than conventional CM inductors. It therefore had better performance than the conventional inductor for high frequency CM noise reduction. The measured DM inductance was 3 pH for conventional inductor and 11 µH for the inductor embodiment of the present invention.

Example 3

Figure 23:
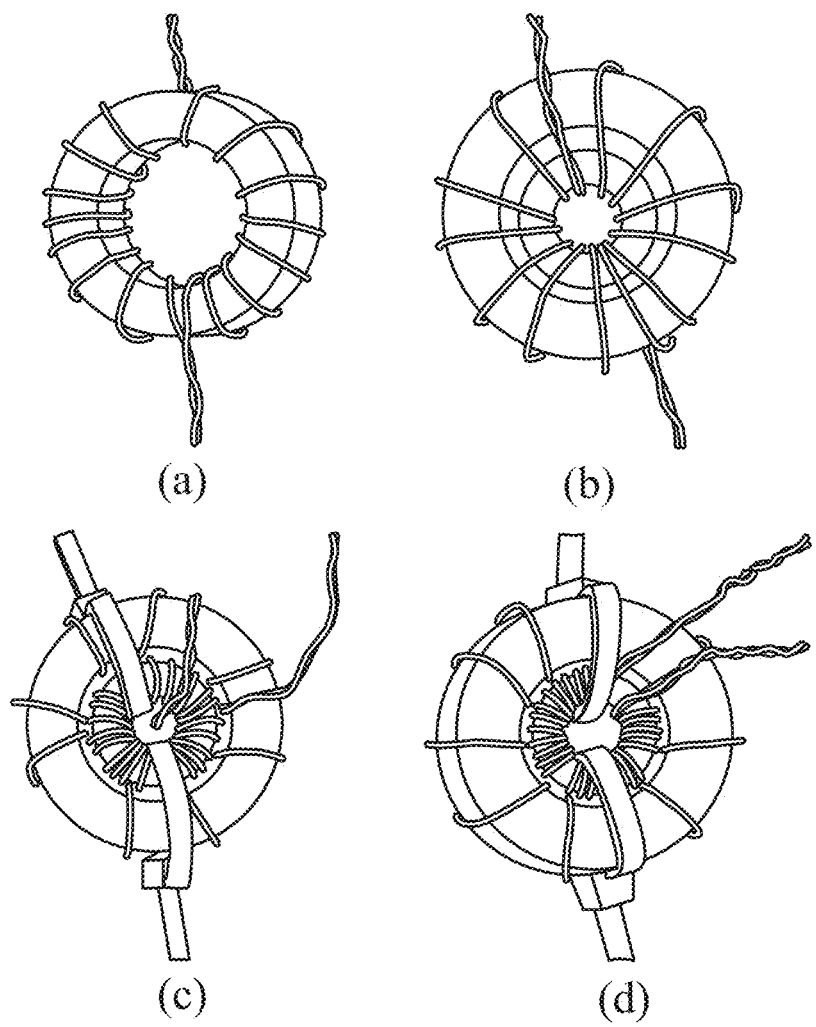
FIG. 23 shows inductor prototypes of (a) a conventional CM inductor, (b) a second convention CM inductor, (c) a CM inductor according to an embodiment of the present invention before optimization, and (d) a CM inductor according to an embodiment of the present invention after optimization.
Figure 24:
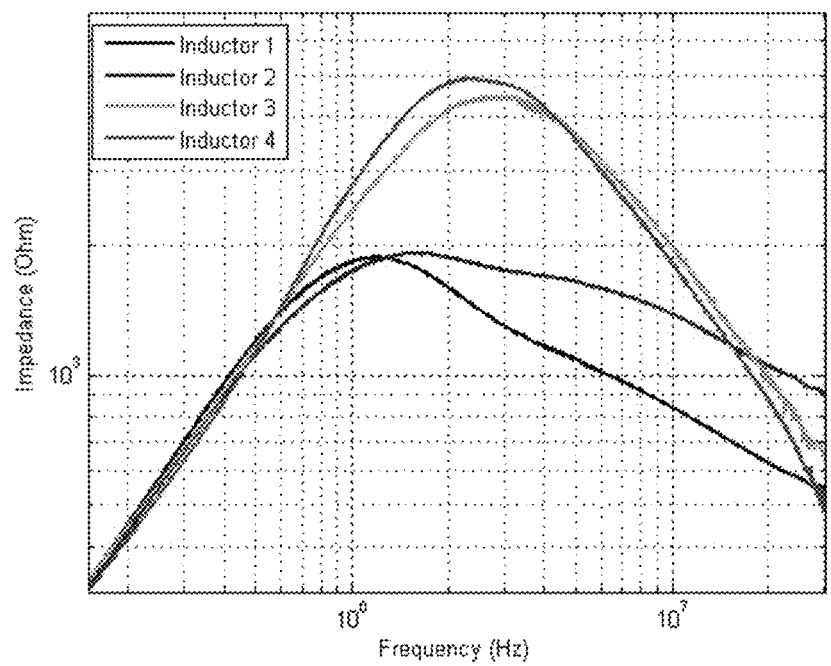
FIG. 24 shows measured CM impedances for the four CM inductor prototypes of FIG. 23.
Figure 25:
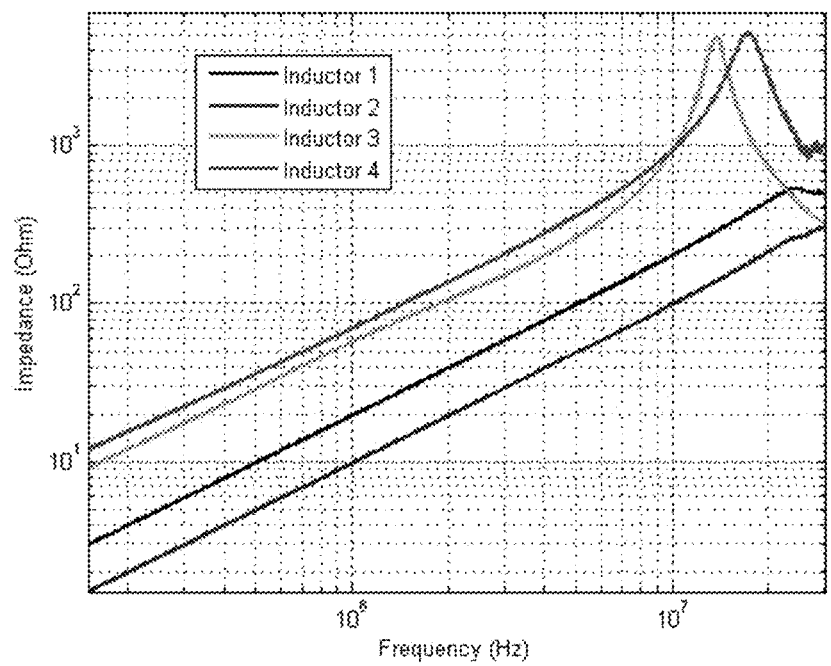
FIG. 25 shows measured DM impedances for the four CM inductor prototypes of FIG. 23.

Four CM inductor prototypes were developed as shown in FIG. 23. The inductors had the parameters shown in Table II. AWG #24 wire was used, and the manufacturer of the outer core and the regular inductor core was Laird-Signal Integrity Products, with core product number 35T1000-00H. The manufacturer of the inner core was TDK, with a core product number of B64290L44X87. The manufacturer of optimized core B was Micrometals, product number T106-63.

TABLE II

Inductor information for Experiments and Simulations

|  | Outer Diameter | Inner Diameter | Height | Number of turns[1] | Initial relative permeability |
|---|---|---|---|---|---|
| Core A | 12.50 mm | 7.5 mm | 5.95 mm | 13 | 2200 |
| Core B | 26.67 mm | 14.23 mm | 11.02 mm | 5 | 5000 |
| Optimized Core A | 12.50 mm | 7.5 mm | 5.95 mm | 16 | 2200 |
| Optimized Core B | 26.9 mm | 14.5 mm | 11.1 mm | 8 | 35 |
| Conventional Inductor | 12.50 mm | 7.5 mm | 5.95 mm | 13 | 2200 |

Inductors (a), (b), (c) and (d) of FIG. 23 will be referred as inductor 1, inductor 2, inductor 3, and inductor 4, respectively. Inductor 1 and 2 were both conventional inductors, but only inductor 2 had two cores wound in parallel. The two cores were exactly the same as inductor 3.

Compared to the inductor 1 and 2, embodiments of the present invention can reduce near magnetic field radiation by about 70%. After optimization, the inductor 4 embodiment reduced the near field radiation by more than 90%. The near magnetic field of the optimized inductor of embodiments of the present invention was nearly eliminated. With the same CM inductance, the embodiments of inductor 3 and 4 possessed greater DM inductance than conventional inductors such as inductor 1 and 2. This gives inductors 3 and 4 a better ability to attenuate DM noise. And with DM inductance this high, the volume of DM inductors could be reduced and greater power density can be achieved.

With the increased flux density inside the cores, attention must be paid to prevent the cores from saturation when designing the proposed CM inductor. At the same time, required CM inductance must be satisfied to provide sufficient CM noise attenuation. Thus, the design considerations of the proposed CM inductor are different with the traditional CM inductor.

There are three most important constraints when designing the proposed CM inductor: 1) required CM inductance, as shown in (13), because most of the CM magnetic flux is inside the cores, the mutual inductance between two inductors is ignored in (13); 2) total near magnetic flux cancellation, which means condition (8) must be satisfied; and 3) both core A and core B cannot be saturated under the worst case, which is when CM and DM flux add together, at the same time, to avoid over design, the flux density inside the cores should also larger than half of saturation flux density, as shown in (14) and (15).

$$L_{CM} = \frac{N_A^2}{\mathfrak{R}_{coreA}} + \frac{N_B^2}{\mathfrak{R}_{coreB}} \quad (13)$$

$$0.5\, B_{sat_A} \le \frac{\Phi_{CM_A}}{A_A} + \frac{\Phi_A}{A_A} \le B_{sat_A} \quad (14)$$

$$0.5\, B_{sat_B} \le \frac{\Phi_{CM_B}}{A_B} + \frac{\Phi_B}{A_B} \le B_{sat_B} \quad (15)$$

Where $B_{sat_A}$ and $B_{sat_B}$ are saturation flux density of material used in core A and core B, respectively. $\Phi_{CM_A}$ and $\Phi_{CM_B}$ are CM flux inside core A and core B respectively, as given by (16) and (17):

$$\Phi_{CM_A} = \frac{2N_A I_{CM}}{\mathfrak{R}_{coreA}} \qquad (16)$$

$$\Phi_{CM_B} = \frac{2N_B I_{CM}}{\mathfrak{R}_{coreB}} \qquad (17)$$

$I_{CM}$ is the CM excitation inside the windings. $\Phi_A$ and $\Phi_B$ were given in (14) and (15), representing the flux inside the cores caused by DM excitation.

Core A and core B may have different saturation requirements, the saturation flux density of both core material is near 0.24 T at 100° C., so the same saturation flux density is used in (14) and (15) as simplification. Based on (8) and (13) to (17), the proposed CM inductor can eliminate the factor of number of turns on core A and core B as shown in (18), which only leaves us core dimensions and design specifications.

$$\frac{16 L_{CM}}{B_{sat}^2} \leq$$

$$\frac{(A_A + A_B)^2 [(\mathfrak{R}_{coreA}(\mathfrak{R}_{coreA} + 4\mathfrak{R}_{gap}))^2 + \mathfrak{R}_{coreB}\mathfrak{R}_{coreA}^2]}{[\mathfrak{R}_{coreA} I_{DM} + (\mathfrak{R}_{coreA} + 2\mathfrak{R}_{gap})I_{CM}]^2} \leq$$

$$\frac{64 L_{CM}}{B_{sat}^2} \qquad (18)$$

Once the cores are selected, the dimensions and design specifications can be substituted into (18), if the inequality is satisfied, the cores could meet the requirements. The number of turns on core A and core B can be solved from (8) and (13). If the inequality is smaller than the lower limit, it means the cores will saturate under the required current rating, bigger cores should be selected, of the inequality is bigger than the upper limit, it means the inductor is over designed. Specifically, the closer the inequality is to the lower limit, the closer the inductor is to an optimized design. CM inductors are designed for DM current rating of 5 A, CM current of 50 mA and saturation flux density was set to 0.24 T at 100° C. The core dimensions and number of turns are showed in TABLE III.

TABLE III

INDUCTOR PARAMETERS FOR EXPERIMENTS AND SIMULATIONS

| Proto-types | Core | Outer Diameter | Inner Diameter | Height | Number of turns[1] | $\mu_r$ |
|---|---|---|---|---|---|---|
| Regular | B | 22.1 mm | 13.7 mm | 6.35 mm | 15 | 4300 |
| Base-line | A//B | 16 mm | 9.6 mm | 6.3 mm | 14 | 4300 |
|  |  | 29 mm | 19 mm | 7.5 mm |  | 40 |
| Proposed | A | 16 mm | 9.6 mm | 6.3 mm | 14 | 4300 |
|  | B | 29 mm | 19 mm | 7.5 mm | 5 | 40 |

Three different CM inductors were designed. All these inductors have a CM inductance of 530 μH. The regular CM inductor is a conventional inductor with winding structure of FIG. 10(e). The proposed CM inductor is an inductor with the proposed winding structure and meets all the considerations (8), (13)-(15). The base-line CM inductor is an inductor with conventional winding structure of FIG. 10(e) but with two parallel cores which are the same as those used in the proposed inductor for a fair comparison.

Experimental Verifications

Figure 26:
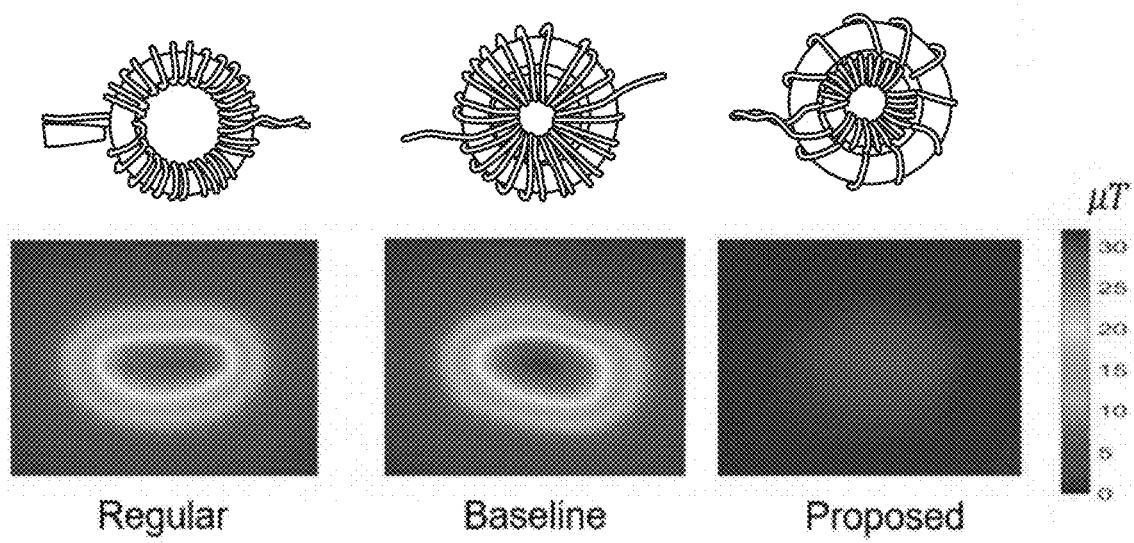
FIG. 26 shows inductor prototypes and measured magnetic field distributions at a regular inductor, a base-line, and a CM inductor according to an embodiment of the present invention.

The measured near magnetic field distributions are also shown in FIG. 26. Compared to the regular and base-line CM inductors, the proposed CM inductor reduced the near magnetic field emission by more than 80%.

Figure 27A:
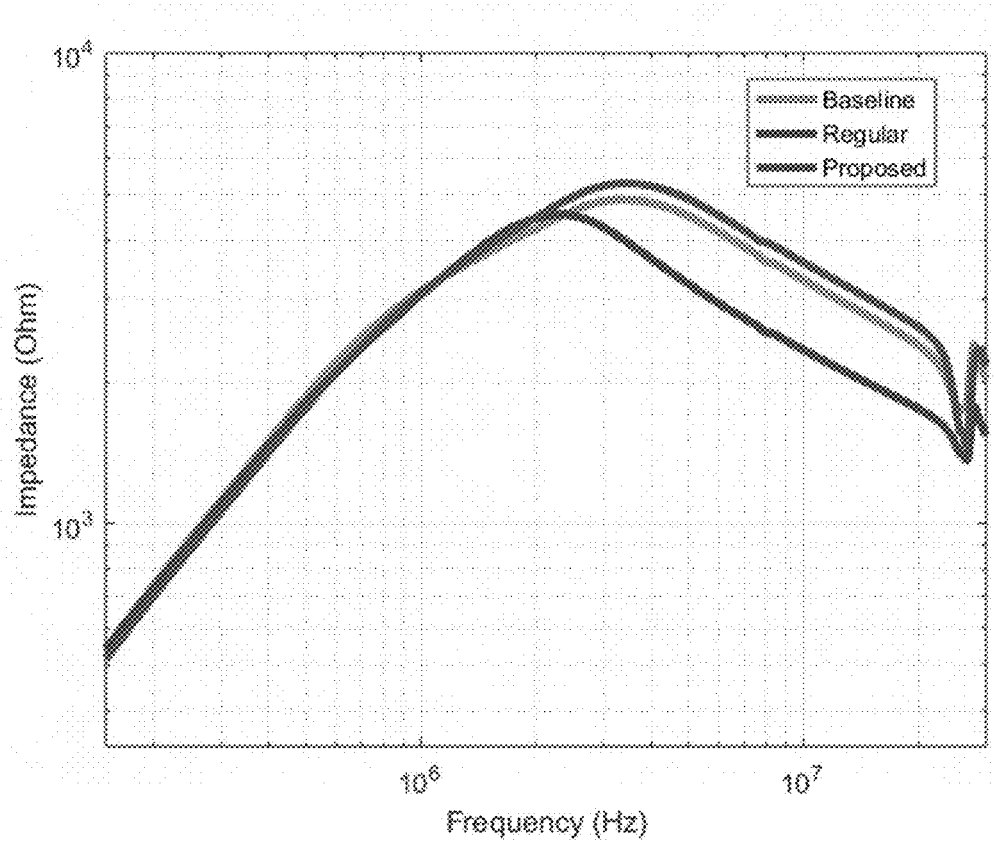
FIG. 27(a) shows measured CM impedances for the inductors of FIG. 26.
Figure 27B:
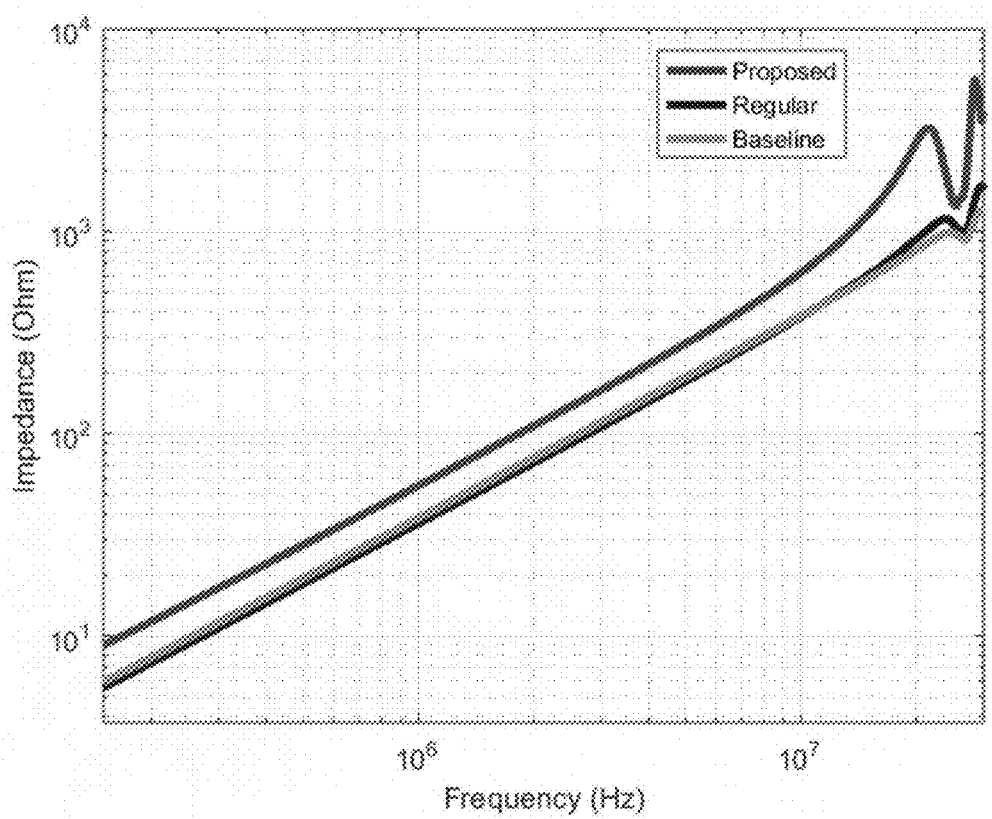
FIG. 27(b) shows measured DM impedances for the inductors of FIG. 26.

The measured CM impedances and DM impedances are compared in FIGS. 27(a) and 27(b). Referring to FIG. 27(a), at low frequencies, all inductors have a CM inductance close to 530 μH. However, the proposed CM inductors have bigger CM impedance than the regular CM inductor at high frequencies because the two inductors' high frequency resonant frequencies are separated which results in a wider bandwidth than conventional CM inductor structures. It therefore has a better performance than the conventional inductors for high frequency CM noise reduction.

The measured DM inductance is 5.2 μH for regular one, 4.7 μH for base-line one, and 10.1 μH for the proposed one.

Figure 28:
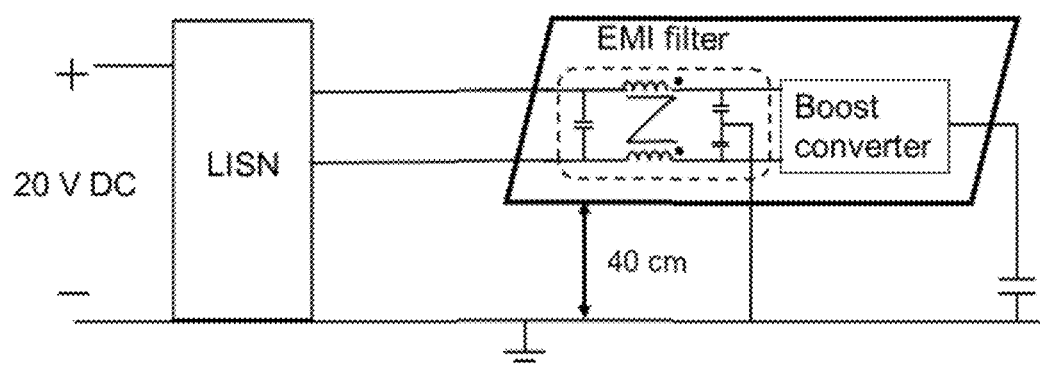
FIG. 28 shows an EMI filter structure and implementation.
Figure 29:
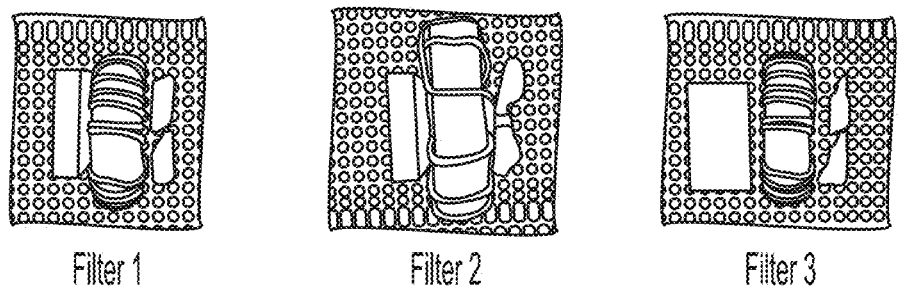
FIG. 29 shows EMI filters built with different CM inductors, (a) filter 1 with regular CM inductor, two 33 pF CM capacitors and 0.1 µF DM capacitor, (b) filter 2 with proposed CM inductor, two 33 pF CM capacitors and 0.1 µF DM capacitor and (c) filter 3 with regular CM inductor, two 33 pF CM capacitors and 0.47 µF DM capacitor.

To verify the effectiveness of these CM inductors, conducted EMI of a boost converter is measured. EMI filters to attenuate both CM and DM EMI noise were designed as showed in FIG. 28. Three EMI filters were built, the capacitors used in the filter 1 and filter 2 are exactly the same. Regular CM inductor in FIG. 26 is used in filter 1 and the proposed CM inductor is used in filter 2. Filter 3 is built with regular CM inductor but with a 0.47 μF DM capacitor. FIG. 29 shows EMI filters built with different CM inductors, (a) filter 1 with regular CM inductor, two 33 pF CM capacitors and 0.1 μF DM capacitor, (b) filter 2 with proposed CM inductor, two 33 pF CM capacitors and 0.1 μF DM capacitor and (c) filter 3 with regular CM inductor, two 33 pF CM capacitors and 0.47 μF DM capacitor.

The performance of these EMI filters is tested and compared in the same boost converter with same load condition. The EMI filters were placed on the same plane with tested boost converter, the plane is 40 cm above ground plane. Two filters were placed at the same position between the boost converter and DC source, cables used for connection are the same. The line impedance stabilization networks (LISN) and a noise separator are used to measure the conducted CM and DM noise. The measured CM and DM noise spectrum is shown in FIGS. 30(a) and 30(b).

Figure 30A:
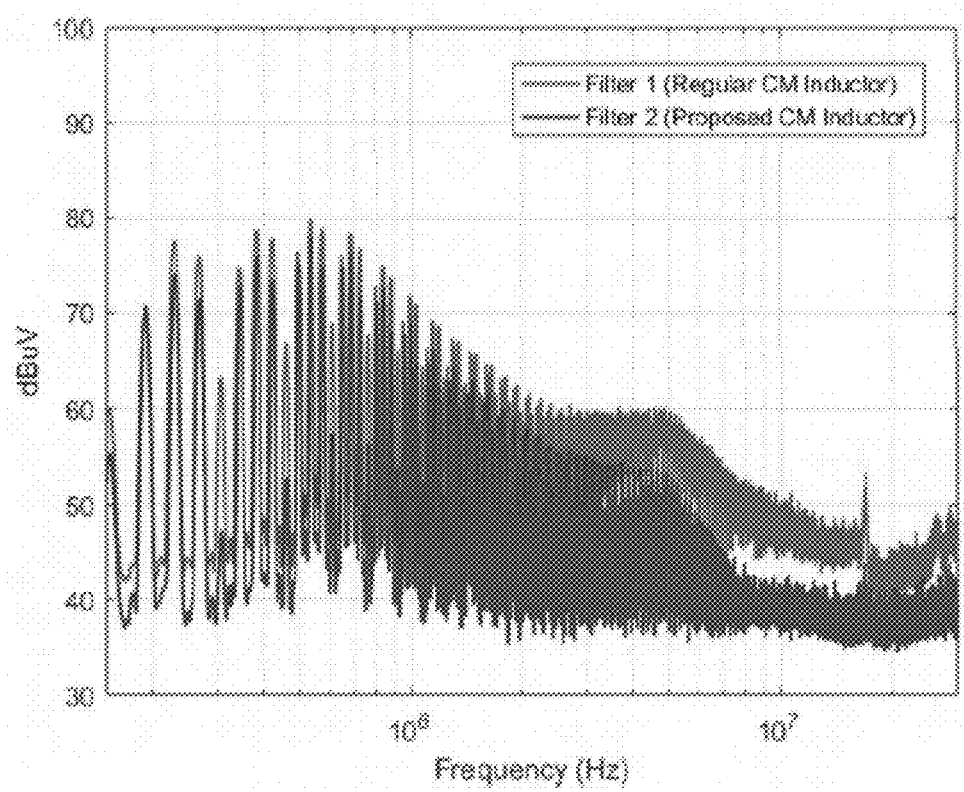
FIG. 30(a) shows comparison of measured CM EMI noise.
Figure 30B:
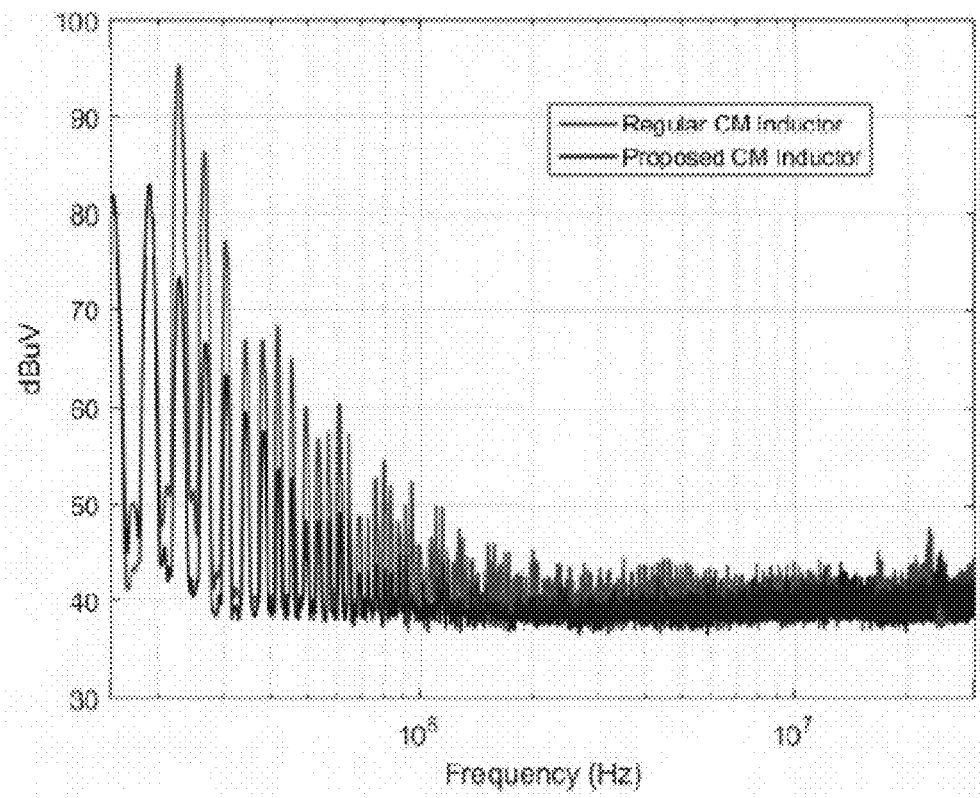
FIG. 30(b) shows comparison of measured DM EMI noise.

As shown in FIG. 30(a), with the proposed CM inductor, CM noise can be reduced more than 10 dB compared to using regular CM inductor due to the reduced near field couplings. Furthermore, the improved high frequency impedance of proposed CM inductor could improve the filter's high frequency noise suppression ability. Other than parasitic couplings between components and traces, the near field emitted from regular CM inductor could also induce noise voltage in the input cable. Special attention must be paid in designing and routing to avoid the induced noise. For the proposed CM inductor, due to the eliminated near magnetic field, there won't be induced noise in the input cable. Thus, there would be much more freedom for designers. Referring to FIG. 30(b), the DM noise can be reduced more than 22 dB with the proposed CM inductor due to eliminated near field coupling between components and increased DM inductance.

As can be observed, for the both CM and DM noise attenuation, filter 2 has much better performance than filter 1. Since both filters have the same capacitors, the result has proved the advantages of the proposed CM inductor can bring EMI benefits compared to regular CM inductor.

Figure 31:
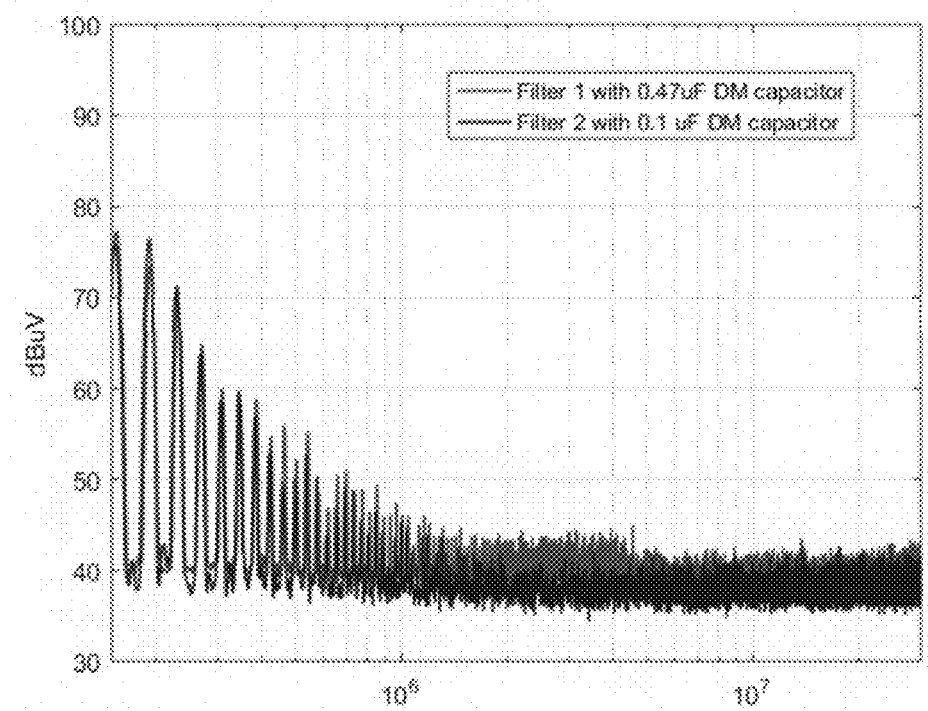
FIG. 31 shows comparison of measured DM EMI noise between filter 1 with 0.47 µF DM capacitor and filter 2 with 0.1 µF DM capacitor.

There are certain tradeoffs for the proposed CM inductor, for example, the additional wires used in the proposed CM inductor is 149 mm, which increase the total wire resistance by 9.8 mil, which could increase copper loss. Also, the proposed CM inductor structure increases the footprint of the EMI filter. However, to obtain the same filtering performance, EMI filters with regular CM inductors would have to add additional components, such as DM capacitors. For example, in this case, for a similar DM attenuation, the filter 1 with regular CM inductor must increase the DM capacitance from 0.1 µF to 0.47 µF. Filter 3 was built for comparison, the DM noise is shown in FIG. 31. Compared to filter 1, the proposed CM inductor increased footprint by 77 mm², the larger capacitor in filter 3 increased footprint by 105 mm². In comparison, the total footprint of filter 3 is 28 mm² larger than filter 2. To obtain similar CM attenuation, larger CM capacitors must be used, or in some cases, another CM inductor to improve high frequency performance must be needed. The design and core selection of another CM inductor will not be discussed in this paper. But with additional CM inductor, the footprint of the regular EMI filter will sure increase.

Figure 32:
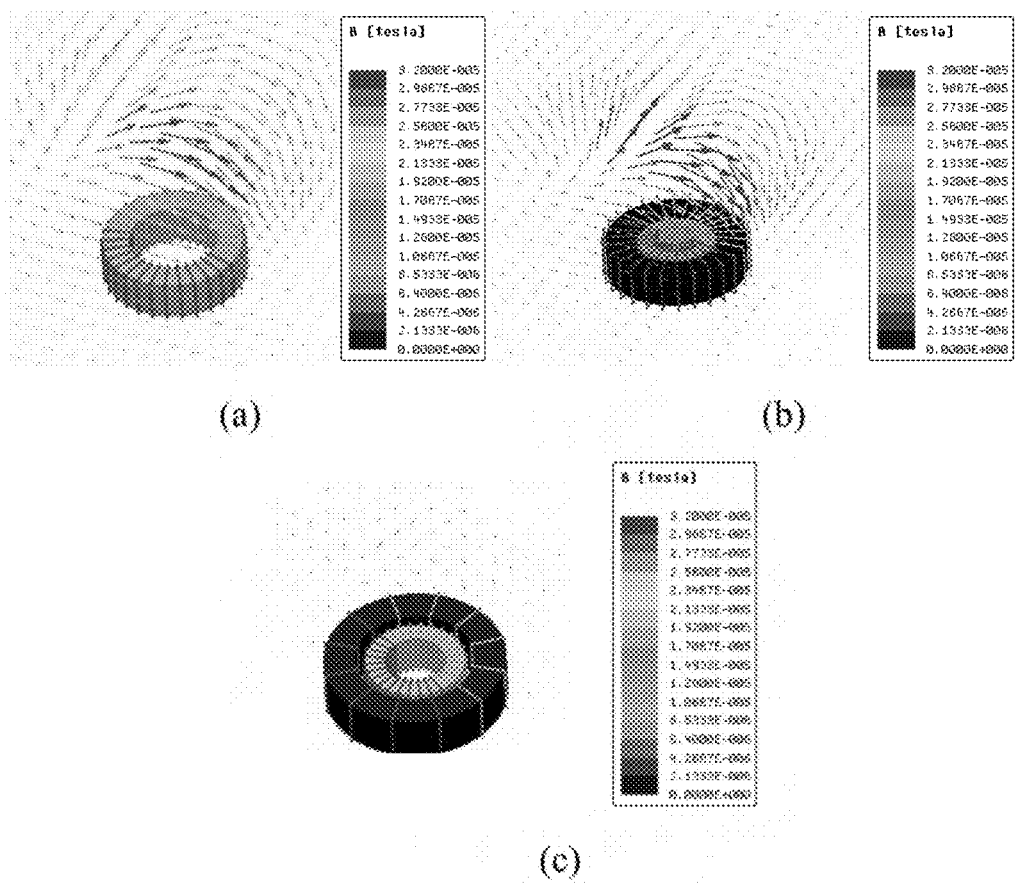
FIG. 32 shows simulation results of a CM inductor according to an embodiment of the present invention.

In comparison, replacing regular CM inductor with proposed CM inductor in an EMI filter offers significant benefits. FIG. 32 shows simulation results of a CM inductor according to an embodiment of the present invention. Referring to FIG. 32, the CM inductor according to the embodiment can reduce the near magnetic field emission. Thus, the EMI due to near field coupling is reduced.

Embodiments of the subject invention consider the magnetic field immunity and near magnetic field reduction for different inductor winding structures. A novel double-twisted winding structure, which includes two magnetic cores, is proposed for CM inductors. The proposed CM inductor can achieve much lower near magnetic field emission, much better magnetic field immunity against the external magnetic field and much bigger DM impedance than conventional winding structures.

The electromagnetic interference (EMI) has become a more and more popular issue when the wide bandgap (WBG) devices are employed in power electronics systems and the switching frequency becomes higher and higher. As one of the most widely used components in power electronics devices, the inductor plays an important role in EMI emission and suppression. On the other hand, to achieve high power density power electronics systems, components are very close to each other, which might give rise to EMI issues. The components in limited space might cause interference to each other via near field couplings. For instance, when the current flows through the inductor in the resonant tank of an LLC resonant converter, the inductor can generate significant time varying magnetic field due to the high frequency and high current ripples. The filter inductors of a WBG device powered photovoltaic inverter can also generate significant near magnetic field emissions due to high percentage of high frequency currents. The magnetic field might couple with other components in the systems, which might compromise the operation condition and damage the systems. At the same time, the magnetic inductors can easily pickup stray near magnetic field generated by other components or PCB traces in the systems. The noise voltage will be induced inside the inductors. When the inductors are used for EMI filter components, the induced noise voltages greatly degrade inductor's performance. A stack inductor structure was proposed to mitigate the near magnetic field emission and achieve immunity against external magnetic field interference. Some improved CM choke structures had been developed to achieve better DM impedance performance.

Embodiments of the subject invention consider the investigation of the induced noise voltage in CM and DM inductors due to external magnetic field. Equivalent current loop and circuit are derived to illustrate the generation and cancellation principles of the induced noise voltages in inductors with various winding structures.

Figure 33:
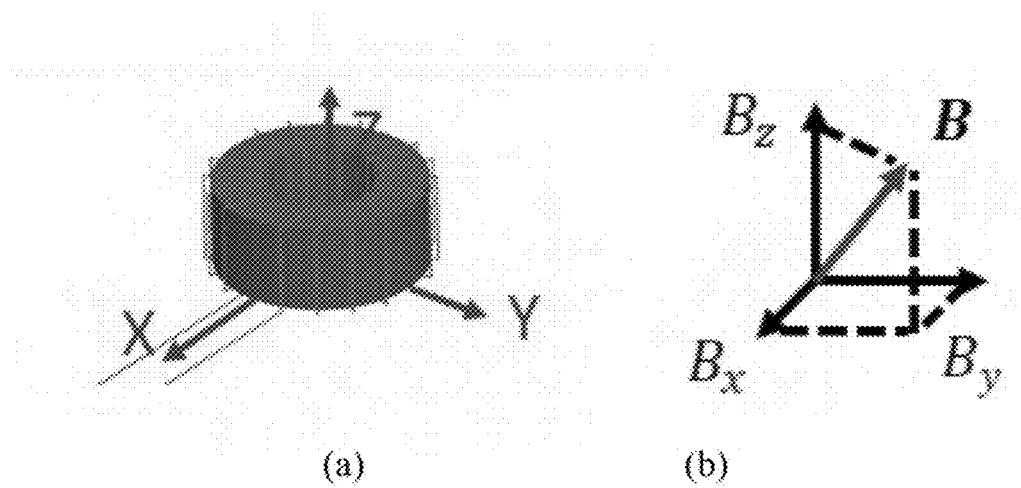
FIG. 33 shows definition of x, y, z direction, and field components.
Figure 34:
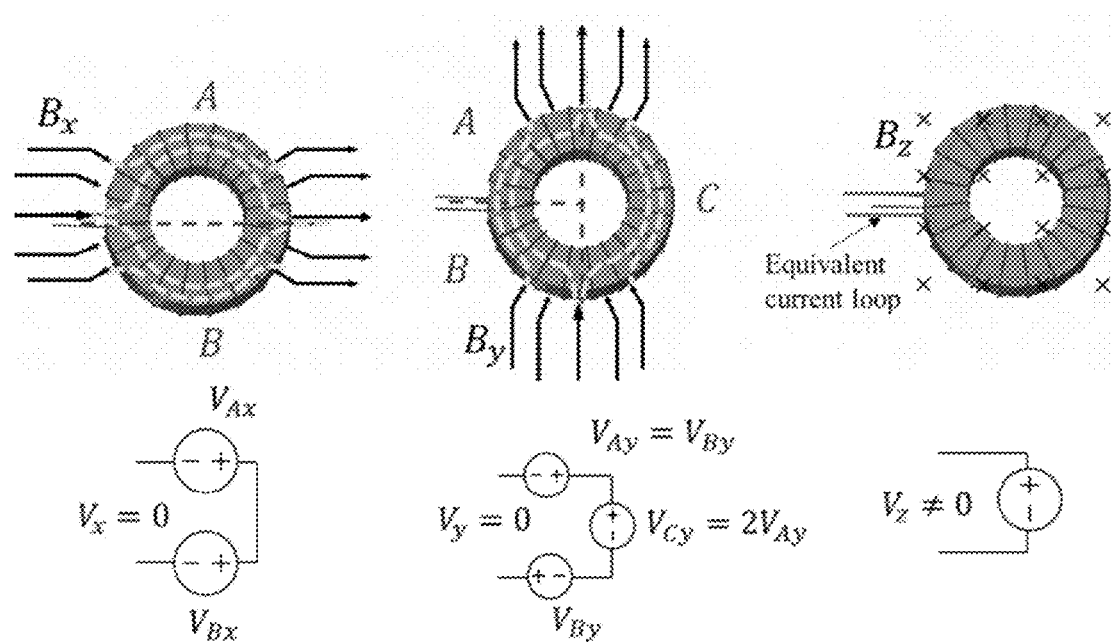
FIG. 34 shows equivalent circuits for a single-ended winding inductor with (a) x direction field, (b) y direction field, and (c) z direction field.

The single-ended toroid inductor is the most commonly used structure and it has the necessary configuration as an inductor. The direction facing towards the incoming line end of the inductor is defined as x direction, the direction facing towards the inductor side is defined as y direction and z direction is defined to be vertical to the inductor plane, indicated in FIG. 33(a). An even magnetic field from arbitrary direction can be decomposed to x, y and z components shown in FIG. 33(b). When an even time-varying magnetic field propagates along x direction towards a single-ended winding inductor, if applying Faraday's Law to the two halve parts of the winding, A and B, as FIG. 34(a) shows, each halve winding is considered to be an induced voltage source. Since the winding structure is symmetrical, the voltages in series on the two separate parts have identical magnitude and they tend to cancel each other. In this case, no noise current is generated. Similarly, when considering the effect of y direction magnetic field, the inductor winding can be viewed as three separate parts as FIG. 34(b) shows. The winding turns relationship among the entire winding and the three individual parts can be expressed as $$N_{total} = N_A + N_B + N_C \quad (19)$$

$$N_A = N_B = \frac{1}{2} N_C \quad (20)$$

where $N_{total}$ is the entire winding turns number $N_A$, $N_B$, $N_C$, are winding turns number of part A, B and C respectively. From equation (19) and (20), the relationship of induced voltages of the three parts can be easily obtained.

$$V = N \frac{AdB}{dt} \quad (21)$$

$$V_A + V_B = V_C \quad (22)$$

A is the wire loop area, B is the time-varying magnetic field. As a result, the induced voltages caused by y direction magnetic field cancel each other in the winding. However, the z direction magnetic field induces a noise voltage in the equivalent current loop of the winding as FIG. 34(c) shows. In this case, the equivalent current loop can be viewed as a one turn coil and the noise voltage cannot be eliminated. Therefore, the noise current is generated in the winding.

Figure 35:
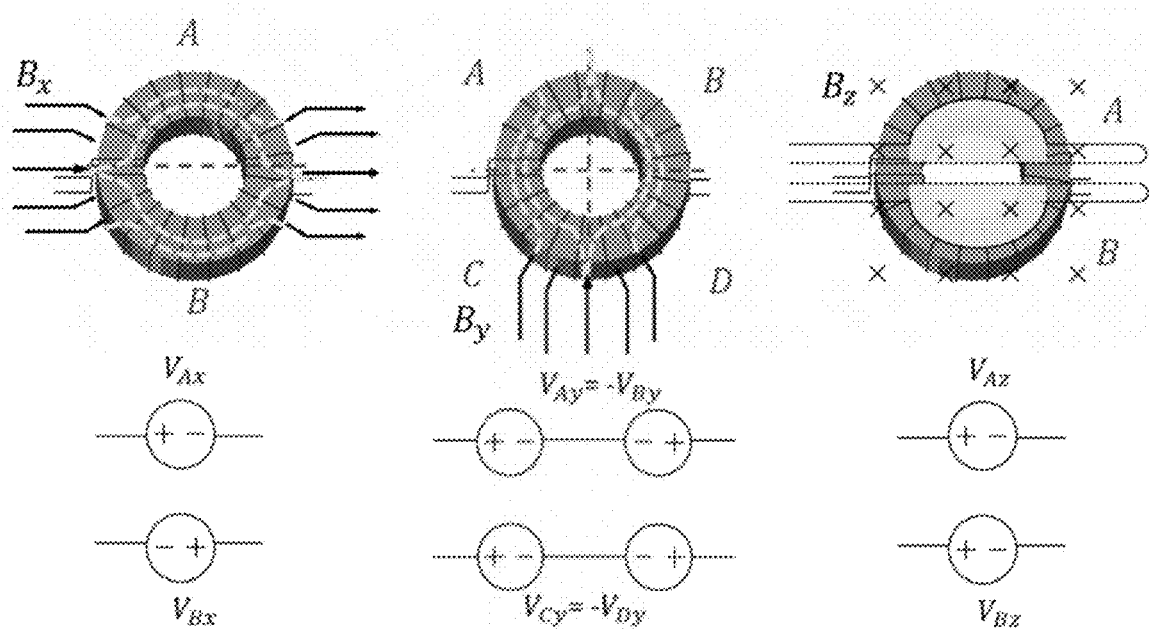
FIG. 35 shows equivalent circuits for a conventional CM inductor with (a) x direction field, (b) y direction field, and (c) z direction field.

The conventional winding structure gives rise to noise voltage induced by external magnetic field. When a time-varying magnetic field comes along x direction the noise voltage sources can be induced on each winding as FIG. 35(a) shows. The noise voltages induced by the magnetic field along y direction can be modeled by considering the two windings to be four separate parts with identical winding turns. The induced noise voltages therefore have identical magnitude and their polarities are shown in FIG. 35(b). Since the induced voltages have inverse polarities on each winding, they tend to cancel each other. Besides, it should be noted that the induced noise voltage caused by the magnetic field coming along the z direction depends on the PCB layout or wiring arrangement. If the equivalent wire loop on the PCB has a limited area (shadow area in FIG. 35(c)), from equation (21), the induced voltage can be very small. On the contrary, the larger wire loop area gives rise to higher induced voltage magnitude. Dot lines in FIG. 35(c) are wiring arrangement on the PCB.

Figure 36:
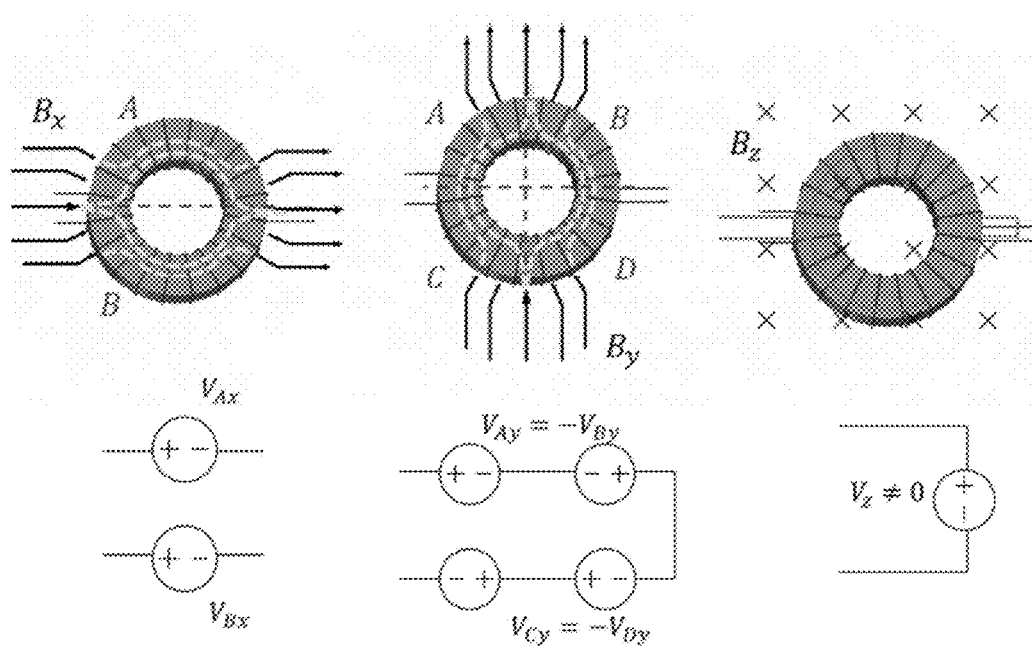
FIG. 36 shows a balanced two winding DM inductor and its equivalent circuits for induced noise sources due to field in (a) x direction, (b) y direction, and (c) z direction.

The balanced two-winding DM inductor can be analyzed similarly. The x direction magnetic field induces one noise voltage on each winding as shown in FIG. 36(a). For the y direction field, two voltage sources are generated on each winding in series with inverse polarities so that they could cancel each other shown in FIG. 36(b). The z direction field induces a noise voltage on the equivalent current loop shown in FIG. 36(c).

Figure 37:
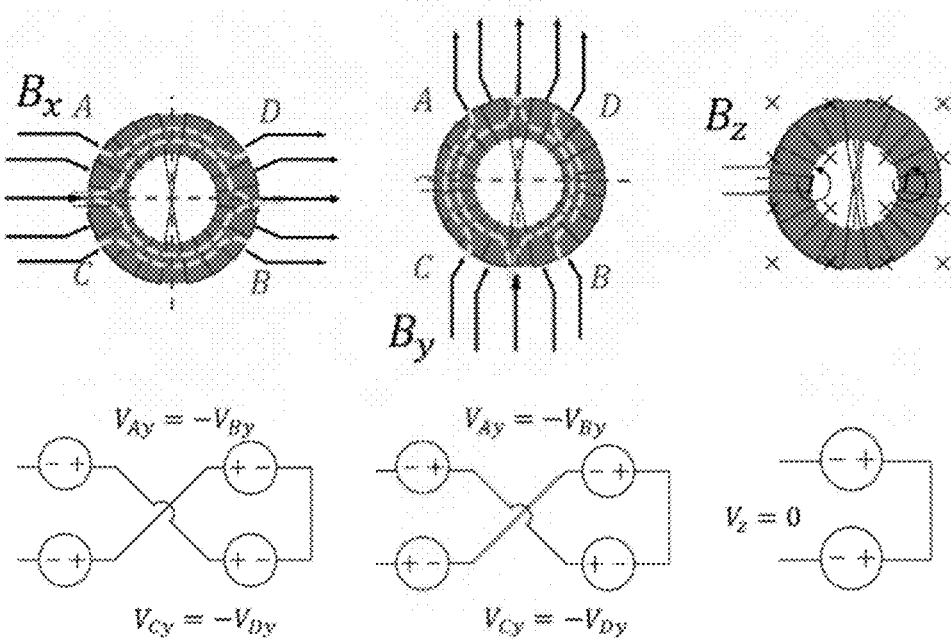
FIG. 37 shows a single twisted winding inductor and its equivalent induced noised circuits in (a) x direction, (b) y direction, and (c) z direction.

The difference between single twisted winding inductor and the single-ended winding inductor is that the wire intersects in the opening window of the single twisted winding inductor. When the time-varying magnetic field comes along x or y direction, a similar analytical procedure can be applied with the conclusion that induced voltages can be eliminated in these two situations, shown in FIGS. 37(a) and 37(b). For magnetic field from z direction, induced voltages with the identical magnitude and inverse polarities are generated separately in both current loops and they tend to cancel each in the winding, shown in FIG. 37(c). By this way, the induced voltages caused by the magnetic field from x, y and z direction can be eliminated.

Figure 38:
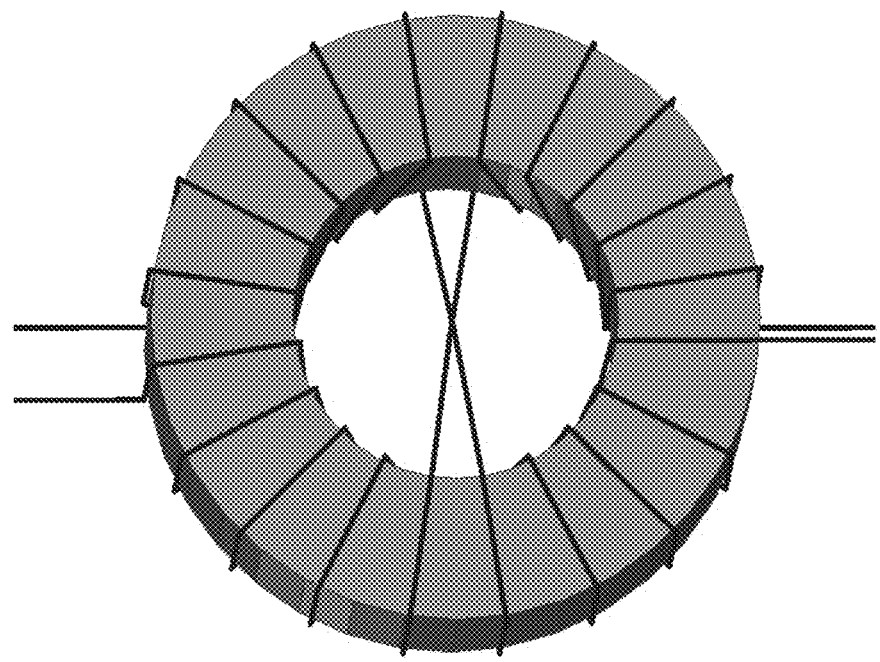
FIG. 38 shows a balanced twisted windings DM inductor.
Figure 39:
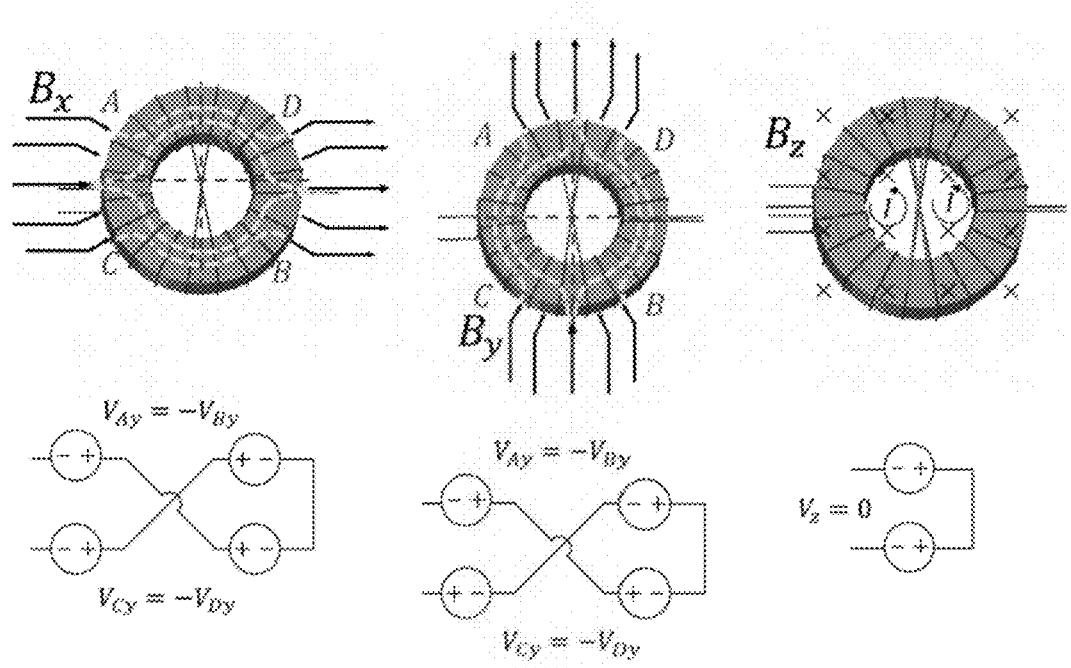
FIG. 39 shows a balanced twisted windings DM inductor and its equivalent induced noised circuit in (a) x direction, (b) y direction, and (c) z direction.

The structure of the balanced twisted windings DM inductor is shown in FIG. 38. When it is conducting DM current, the two windings are positive coupled to generate great DM impedance when conducting DM current. The induced voltages caused by the magnetic fields from x, y and z directions can be derived in similar analytical procedure and the equivalent circuits are shown in FIGS. 39(a), 39(b), and 39(c). For the situations that the magnetic fields come along x and y direction, the induced noise voltages on one winding can be canceled by each other.

Moreover, the z direction magnetic field also induces inverse polarity noise voltages in the two current loops. In conclusion, the balanced twisted windings DM inductor has immunity against external magnetic field from all directions.

Figure 40:
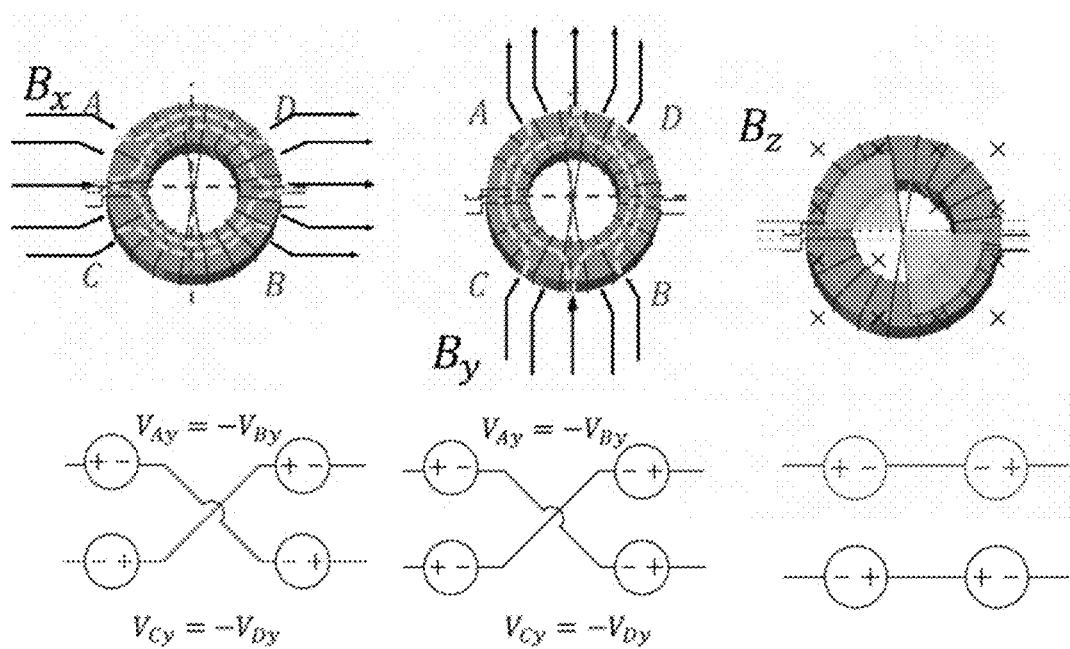
FIG. 40 shows balanced twisted windings CM inductor current loops and its equivalent induced noised circuits in (a) x direction, (b) y direction, and (c) z direction.
Figure 41:
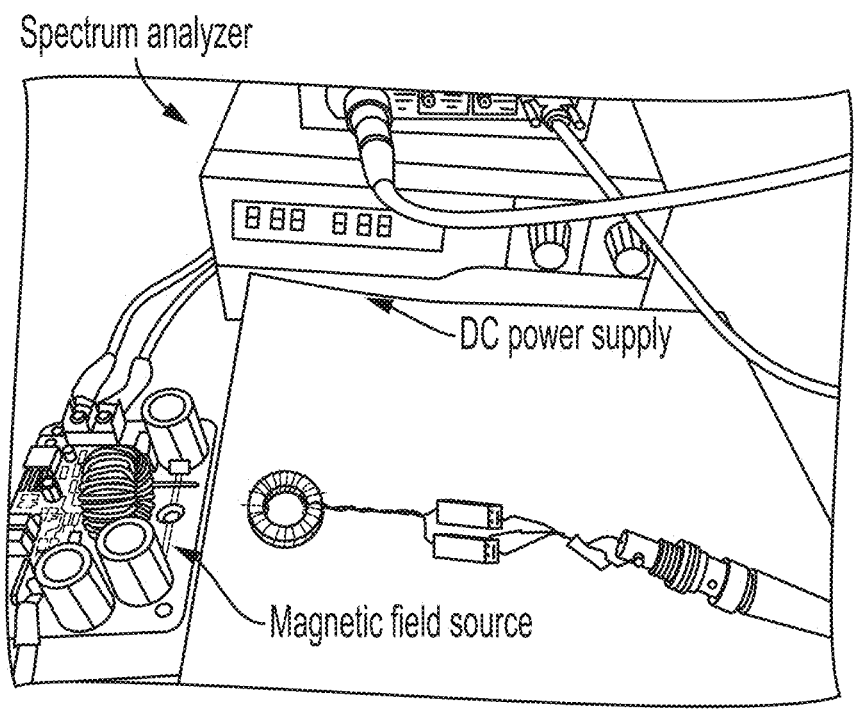
FIG. 41 shows (a) experiments set-up, (b) single-ended winding inductor, (c) single twisted winding inductor, (d) balanced two winding CM inductor, (e) balanced twisted windings CM inductor, (f) balanced two winding DM inductor, and (g) balanced twisted windings DM inductor.
Figure 41:
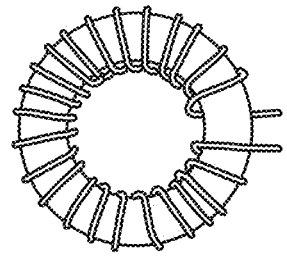
Figure 41:
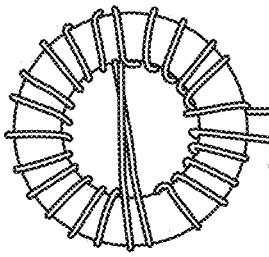
Figure 41:
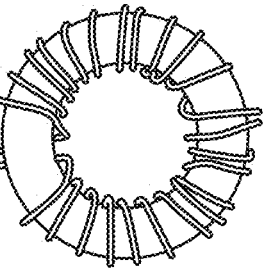
Figure 41:
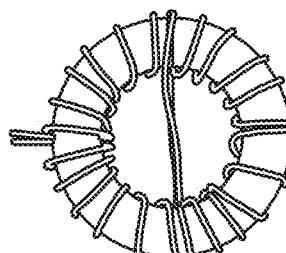
Figure 41:
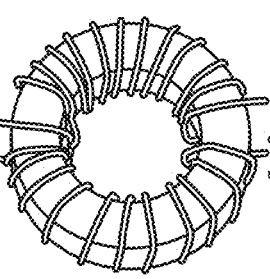
Figure 41:
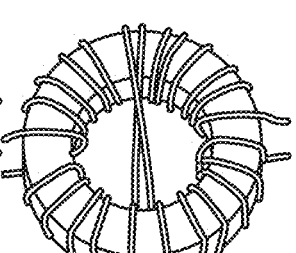

The difference between the conventional balanced two winding CM inductor and the balanced twisted windings CM inductor is the wire twisted arrangement in the inductor opening window. The noise voltages generated in balanced twisted windings CM inductor by x and y direction magnetic field can be derived, shown in FIGS. 40(a) and 40(b). It should be noted that the PCB layout still affects the induced voltages caused by z direction magnetic field. Referring to FIG. 40(c), for instance, if the two sector areas (shadow area) of the red winding have identical area, inverse voltages will be induced on quarter windings with identical magnitude so that they can cancel each other. In another way, if the shadow area is designed to be small, the induced voltage magnitude could be small as well.

TABLE IV is to summarize the external magnetic field immunity of the inductor structures analyzed above. It should be noticed that the twisted winding structures are showing better immunity property. Experiments are carried out in next section to verify the previous analysis.

The inductor structures are built with powder cores with relative permeability of 5000. The model number is 35T1000-00H from Laird-Signal Integrity Products. The inner diameter is 14.23 mm and the outer diameter is 26.67 mm. Core height is 11 mm. The turns number for both single winding inductors and two-winding inductors is 24. All the inductors have identical dimensions and turns number to keep the inductance identical. The inductance of inductors with single winding structures is 2.67 mH. The CM inductance of CM inductors with two winding structure is 637 µH and the DM inductance of DM inductors with two winding structure is 2.67 mH. AWG #26 wire is used for all inductors.

A DC-DC 600 W boost Converter from Shenzhen Geree Electronics Co., Ltd is used for magnetic field source, with the input voltage 30V and input current 11.5 A. The DC voltage source is Switching DC Power Supplies Discontinued Model 1902 from BK PRECISION. A 4.7Ω resistor is used for load. All the inductors were measured at the distance of 30 mm from the converter. A RSA306B REAL-TIME SPECTRUM ANALYZER from Tektronix was used for measuring both CM and DM noise spectra in the inductors. To measure the CM noise, the inductor windings were connected in parallel. To measure the DM noise, the inductor windings were connected in series. Experiment set up and inductor prototypes are shown in FIG. 41(a)-41(g).

TABLE IV

MAGNETIC FIELD IMMUNITY OF INDUCTORS

| Structure types | Noise cancellation | | |
|---|---|---|---|
| | X direction | Y direction | Z direction |
| Single-ended winding inductor | Yes | Yes | No |
| Single twisted winding inductor | Yes | Yes | Yes |
| Balanced two-winding CM inductor | No | Yes | Depending on PCB layout |
| Balanced twisted windings CM inductor | Yes | Yes | Depending on PCB layout |
| Balanced two-winding DM inductor | No | Yes | No |
| Balanced twisted windings DM inductor | Yes | Yes | Yes |

Figure 42:
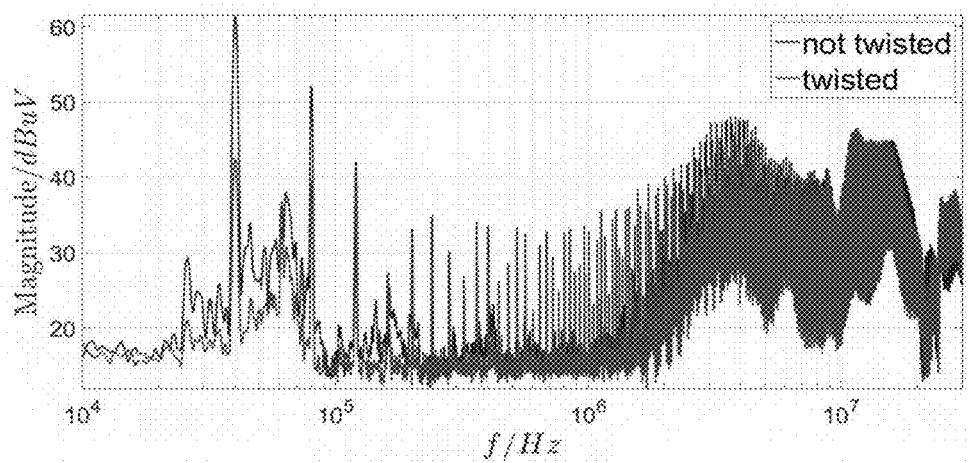
FIG. 42 shows noise spectra for single winding inductors.
Figure 43:
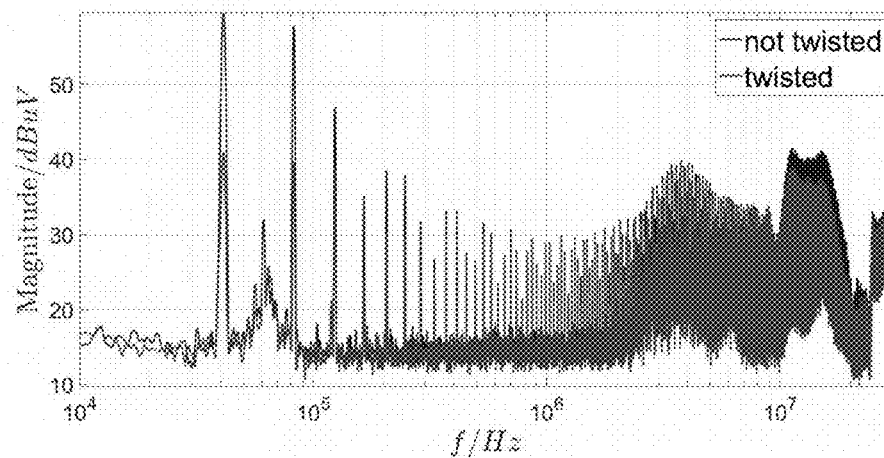
FIG. 43(a) shows noise spectra of CM noise for two winding CM inductors.
FIG. 43(b) shows noise spectra of DM noise for two winding CM inductors.
Figure 43:
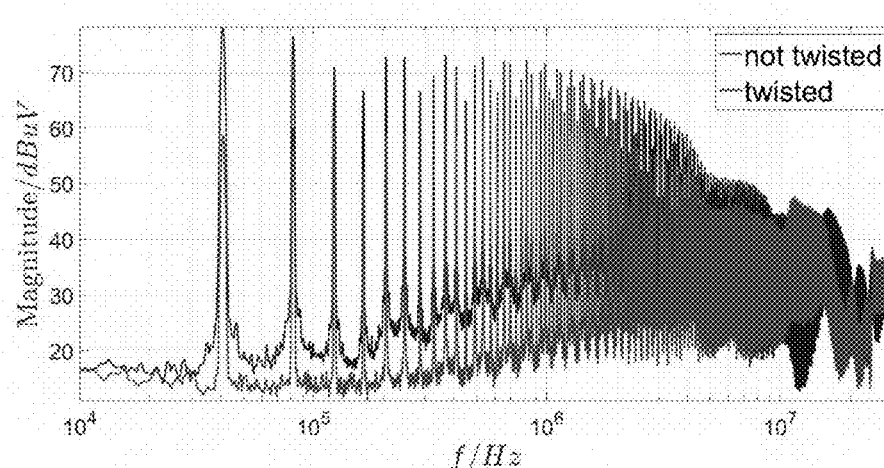
Figure 44A:
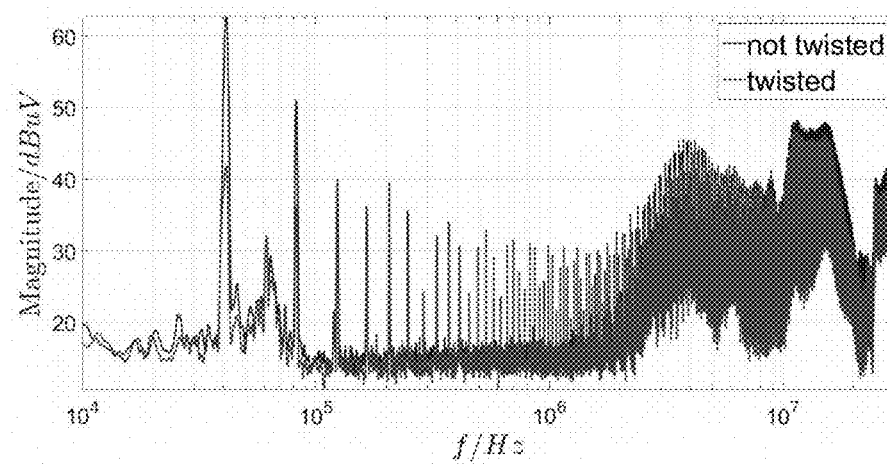
FIG. 44(a) shows noise spectra of CM noise for two winding DM inductors.
Figure 44B:
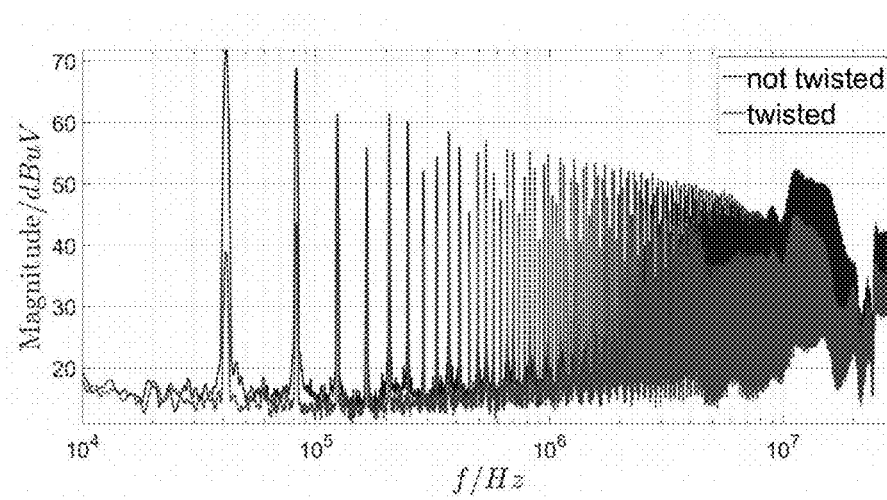
FIG. 44(b) shows noise spectra of DM noise for two winding DM inductors.

FIG. 42 shows the measurement result for the single winding structure inductor where the inductor with twisted winding structure has approximately 20 dB reduction compared with that without twisted winding structure. For the two windings CM inductors, the twisted structure compared with the not twisted structure has 20 dB reduction for both CM and DM noise as shown in FIGS. 43(a) and 43(b). For the two winding DM inductors, the twisted structure compared with the structure not twisted has 33 dB and 20 dB reduction for CM and DM noise respectively as shown in FIGS. 44(a) and 44(b). In conclusion, the twisted technique can lower the induced noise magnitude by at least 20 dB and up to 33 dB in the inductor core.

As discussed above, the balanced two winding CM or DM inductor generates great near magnetic field radiation when conducting DM or CM current respectively and noise voltages will be induced by external magnetic field due to their winding structures. One approach to reduce near magnetic field is to twist the windings in the canter of the inductor open windows. However, leakage flux of the inductors, in the form of near magnetic field emission, provides DM inductance for CM inductor or CM inductance for DM inductor. The suppression of near magnetic field emission gives rise to the reduction in DM/CM inductance of CM/DM inductor if the twisted winding technique is applied. Although the twisted winding technique is useful in near magnetic field emission suppression, the reduction in DM/CM inductance for CM/DM inductor is not expected. A KEYSIGHT impedance analyzer is used to measure the inductance of the inductors and the results are shown in TABLE V. The DM inductance for balanced twisted windings CM inductor is lower than that of the balanced conventional CM inductor and the CM inductance for balanced twisted windings DM inductor is also lower than that of the balanced two winding DM inductor, which verify the previous analysis.

A new CM inductor structure is proposed to achieve near magnetic field radiation reduction, DM inductance augment and external magnetic field immunity. The proposed inductor is including two cores. Core A with smaller size is placed in the open window of core B. The winding arrangement is show in FIG. 45.

Figure 45:
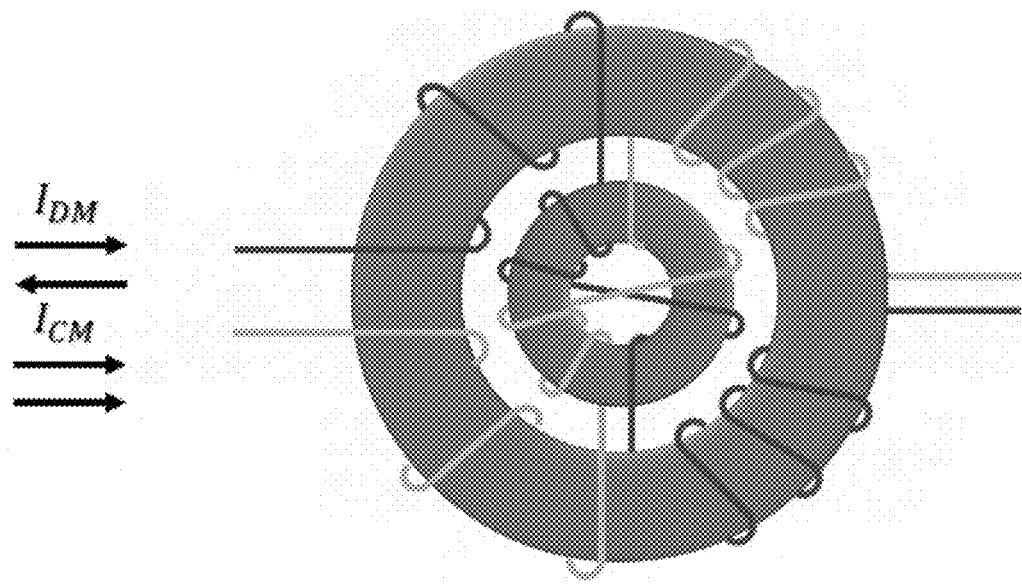
FIG. 45 shows a CM inductor according to an embodiment of the present invention.

Referring to FIG. 45, the configuration of the proposed structure can be defined as double twisted two winding structure since each of core A and B has a twisted two winding CM inductor structure. The proposed inductor is entirely symmetrical in structure. To achieve external magnetic field immunity, identical winding turns number should be assigned to every 90° span on each core respectively. Therefore, the winding turns number should be a multiple of four.

Figure 46:
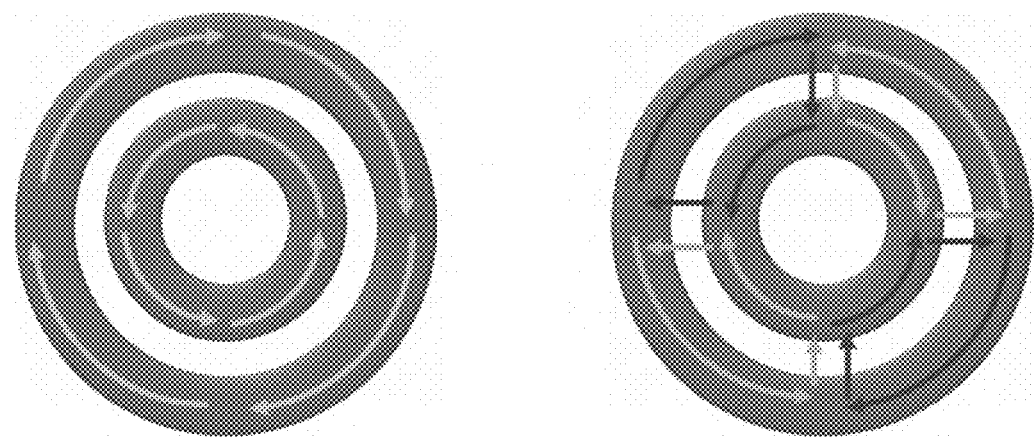
FIG. 46 shows CM inductor magnetic flux conducting at (a) CM current and (b) DM current.

When CM current is conducted, most of the magnetic flux is confined within the high permeability cores as FIG. 46(*a*) shows, which can provide CM impedance as the conventional CM inductor. When DM current is conducted, the magnetic flux in both cores flows as FIG. 46(*b*) shows. In this case, leakage flux of the cores goes through the high permeability core magnetic paths instead of air, confining leakage flux within the inductor cores to increase DM impedance and reduce near magnetic field radiation simultaneously. Moreover, the leakage fluxes in air generated by each core are in reversed polarities so that they can cancel each other.

TABLE V

INDUCTORS INDUCTANCE

| Structure types | CM inductance | DM inductance |
| --- | --- | --- |
| Single-ended winding inductor | — | 2.67 mH |
| Single twisted winding inductor | — | 2.67 mH |
| Balanced two winding CM inductor | 637 µH | 6.37 µH |
| Balanced twisted windings CM inductor | 637 µH | 2.07 µH |
| Balanced two winding DM inductor | 1.51 µH | 2.67 mH |
| Balanced twisted windings DM inductor | 0.65 µH | 2.67 mH |

Figure 47:
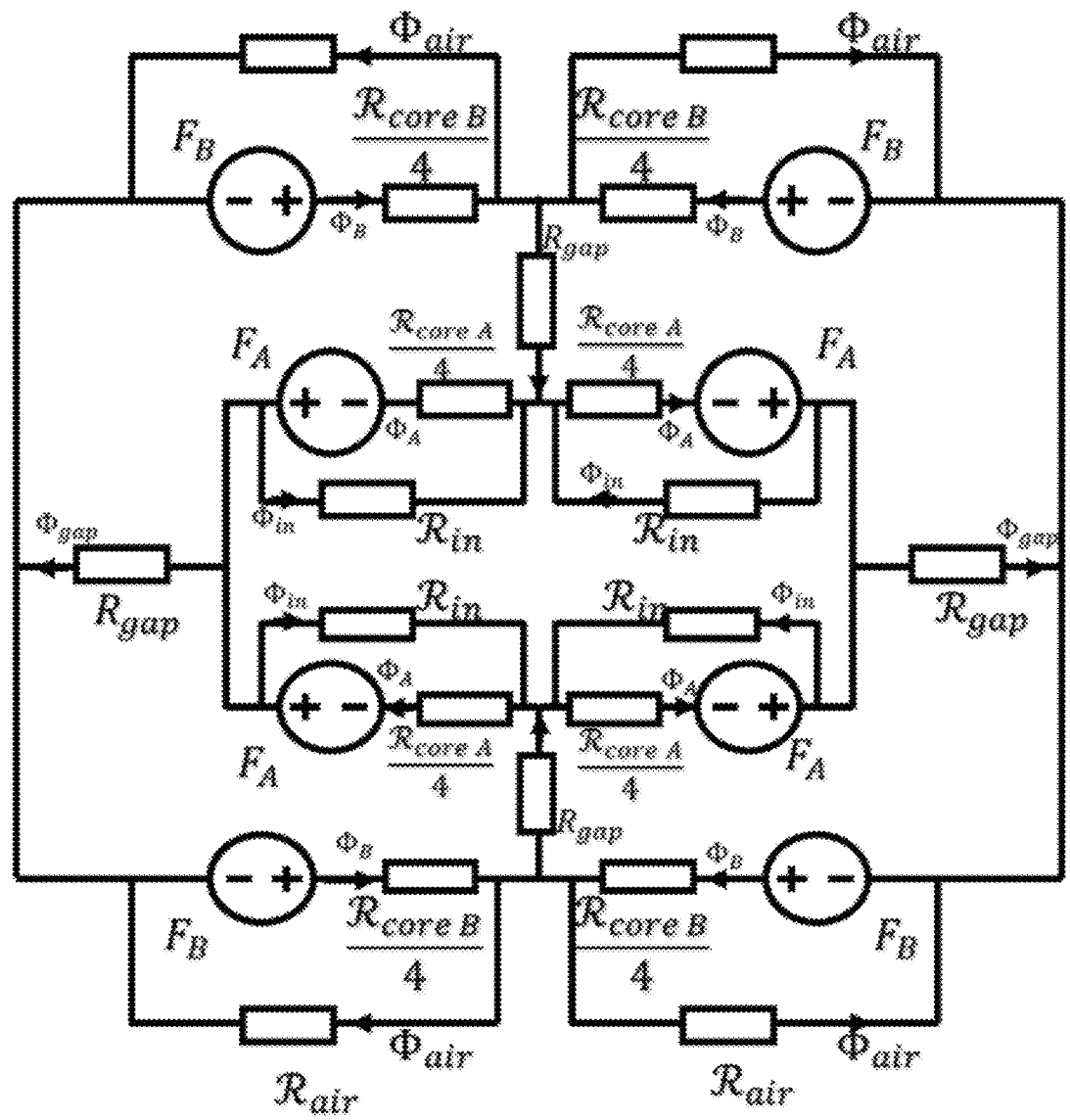
FIG. 47 shows a magnetic circuit for a CM inductor according to an embodiment of the present invention.
Figure 48:
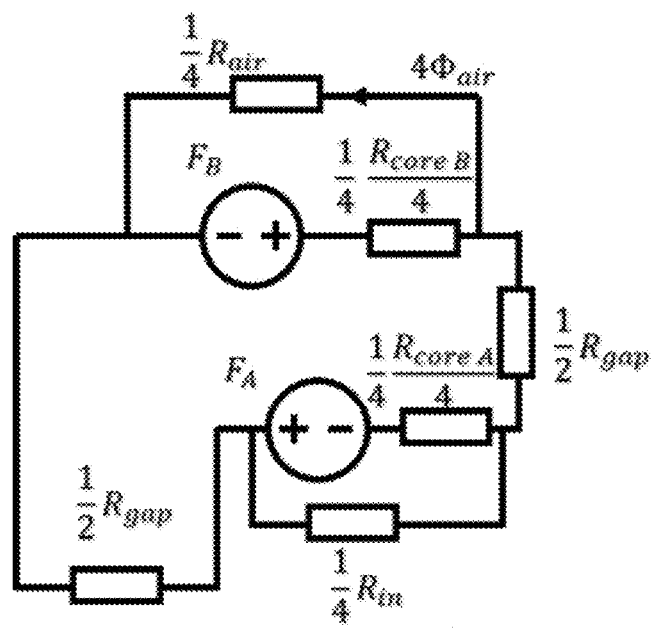
FIG. 48 shows a simplified magnetic circuit for a CM inductor according to an embodiment of the present invention.

The composed proposed structure and its equivalent magnetic circuit can be therefore derived for further investigation. In the magnetic circuit shown in FIG. 47, F and F represent the MMF generated by the quarter section of the cores respectively. φ and φ represent the magnetic flux flowing through the cores restively. $\mathcal{R}$core and $\mathcal{R}$core represent the reluctance of the entire cores respectively. $\mathcal{R}$in represents the reluctance of air in the open window of core A and φin represents the flux flowing through it. $\mathcal{R}$air represents the reluctance of air in space around the core B and φpair represents the magnetic flux flowing through it. $\mathcal{R}$gap represents the equivalent reluctance of the air gap between the two cores and φgap represents the flux flowing through it. Because of the symmetry of the proposed inductor, the magnetic circuit in FIG. 47 can be further simplified to FIG. 48 for calculation propose.

Since the φpair represents the near magnetic field radiation from the proposed CM inductor with DM current excitation, the near magnetic field radiation can be eliminated if φair is greatly reduced.

Assumption is made as $$\mathcal{R}_{core\,A}, \mathcal{R}_{core\,B} < \mathcal{R}_{gap} \ll \mathcal{R}_{air}, \mathcal{R}_{in} \quad (23)$$

Base on FIG. 46, φair can be derived as $$4\phi_{air} \approx \frac{F_B\left(\mathcal{R}_{gap} + \frac{\mathcal{R}_{coreA}}{16}\right) - F_A \frac{\mathcal{R}_{coreB}}{16}}{\left(\mathcal{R}_{gap} + \frac{\mathcal{R}_{coreA}}{16} + \frac{\mathcal{R}_{coreB}}{16}\right) \times \frac{1}{4} \mathcal{R}_{air}} \quad (24)$$

From equation (24), the elimination can be achieved if φair reduces to zero. Then the elimination condition can be derived as $$\frac{F_B}{F_A} = \frac{N_B}{N_A} = \frac{\frac{\mathcal{R}_{coreB}}{16}}{\mathcal{R}_{gap} + \frac{\mathcal{R}_{coreA}}{16}} \quad (25)$$

In equation (25), N and N represent the winding turns number on core A and B respectively. The φin has inverse direction in space compared with φair so they tend to cancel each other. It should also be noted that the φin is considered to have little contribution to the near magnetic field radiation since it is confined in the center of core A.

Several conditions should be satisfied to design a proposed CM inductor with specific inductance L M, When conducting CM current, the mutual inductance between core A and B is ignored as most of the magnetic flux is confined within the cores.

$$L_{CM} = \frac{N_A^2}{\mathcal{R}_{coreA}} + \frac{N_B^2}{\mathcal{R}_{coreB}} \quad (26)$$

$$\mathcal{R}_{coreA} = \frac{l_A}{\mu_0 \mu_A A_A} \quad (27)$$

$$\mathcal{R}_{coreB} = \frac{l_B}{\mu_0 \mu_B A_A} \quad (28)$$

$$\mathcal{R}_{gap} = \frac{l_{gap}}{\mu_0 A_{gap}} \approx \frac{r_B - R_A}{\mu_0 A_{gap}} \quad (29)$$

$$A_{gap} \approx \frac{\pi(r_B + R_A)(H_B + H_A)}{16} \quad (30)$$

In the equations, l and l represent the effective length of core A and B respectively. µ and µ represent the relative permeability of core A and B respectively. µ0 is the vacuum permeability. The r represents the inner radius of core B and the R represents the outer radius of core A. The $\mathcal{R}$ core and $\mathcal{R}$core represent the reluctance of core A and B. The lgap represents the equivalent length of the air gap between core A and B and it can be approximately equal to the difference between r and. In equation (29), H and H represent the height of the two cores. In equation (30), the Agap represents the equivalent cross-sectional area of the magnetic flux. It is approximately equal to 18 cross-sectional area of the whole air gap between the two cores. The fringing effect is ignored since the difference between H and, r and R is assumed to be limited.

From equation (25), it indicates that the MMF in core B should be lower than that in core A, which means that the wiring turns on outer core should be less than that on the inner core. Also, if the parameters of the cores are modified to strictly meet the numeric relationship between turns number and inductor reluctance as equation (25) shows, the proposed structure can therefore be further optimized. TABLE VI includes the parameters for conventional structure, proposed structures before and after optimized.

TABLE VI

INDUCTOR PARAMETERS

| Inductor structure | Core | Outer diameter | Inner diameter | Height | Turns number | $\mu_r$ |
|---|---|---|---|---|---|---|
| Conventional structure | B | 26.67 mm | 14.23 mm | 11 mm | 22 | 5000 |
| Proposed structure | A | 12.50 mm | 7.50 mm | 5.95 mm | 24 | 2200 |
|  | B | 26.67 mm | 14.23 mm | 11 mm | 20 | 5000 |
| Optimized proposed structure | A | 12.50 mm | 7.50 mm | 5.95 mm | 48 | 2200 |
|  | B | 26.90 mm | 14.50 mm | 11.1 mm | 20 | 14 |

Figure 49:
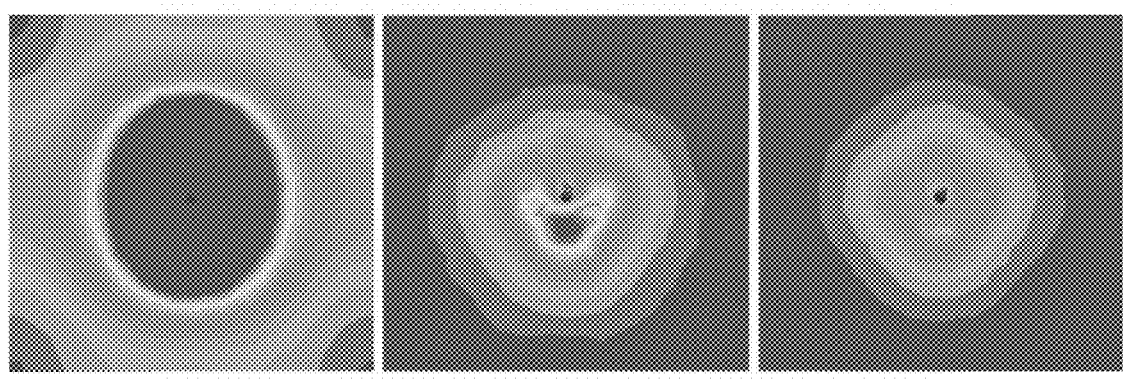
FIG. 49 shows near field emission simulation for (a) conventional CM inductor, (b) a CM inductor according to an embodiment, and (c) an optimized CM inductor according to an embodiment.

All the inductors were designed to obtain identical CM inductance L M 637. All three inductors satisfy equation (26). The optimized proposed inductor also satisfies equation (25) when proposed inductor does not. FIG. 49 shows the simulation results which are measured at the distance of 25 mm from the top of the inductors. It can be found that both proposed and optimized proposed inductors can significantly reduce near magnetic emission compared with the conventional structure inductor. The optimized proposed inductor can further reduce the near magnetic field emission compared with the proposed structure.

Figure 50:
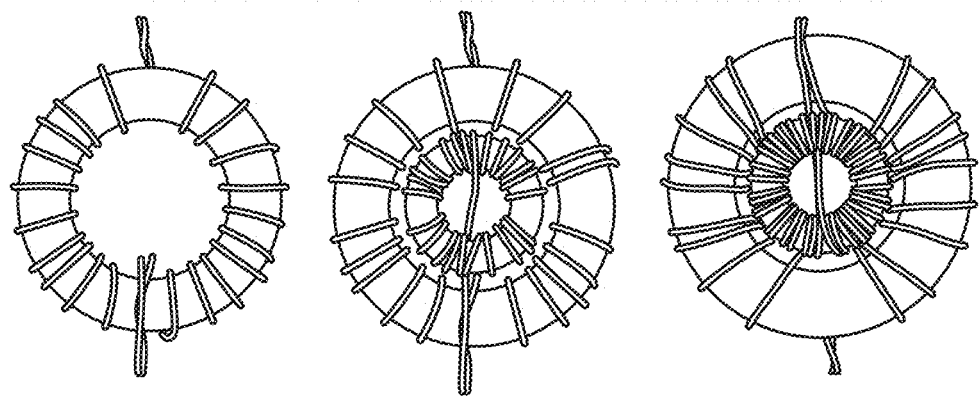
FIG. 50 shows prototypes for (a) conventional CM inductor, (b) a CM inductor according to an embodiment, and (c) an optimized CM inductor according to an embodiment.
Figure 51A:
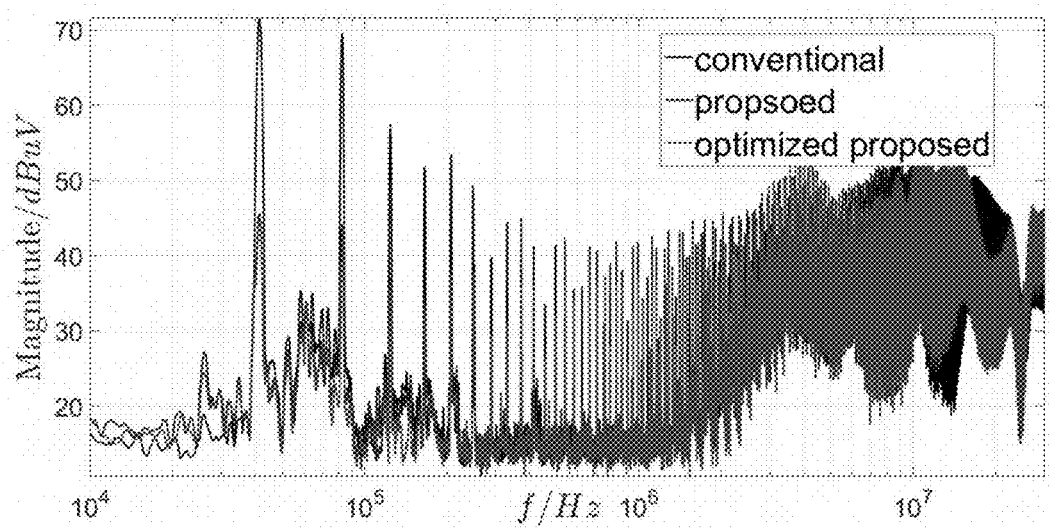
FIG. 51(a) shows noise spectra of CM noise for three CM inductors of FIG. 50.
Figure 51B:
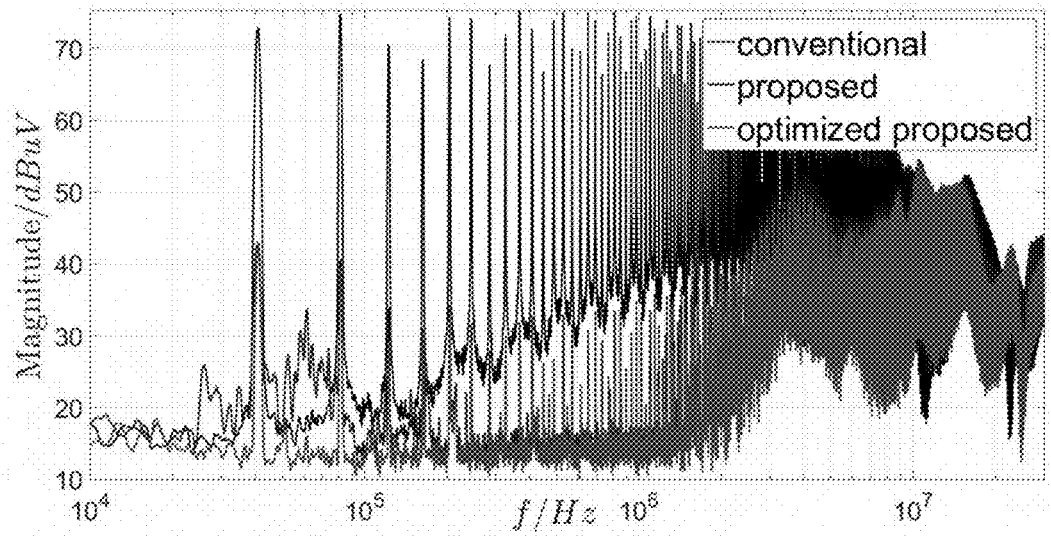
FIG. 51(b) shows noise spectra of DM noise for three CM inductors of FIG. 50.

Three inductor prototypes, shown in FIG. 50, were built referring to the parameters in TABLE VI. AWG #26 is used for conventional and proposed inductor structure, and AWG #28 is used for the optimized proposed structure inductor. The measurement was also carried out with experiment set up shown in FIG. 41(a) and the results are shown in FIGS. 51(a) and 51(b).

For both CM and DM induced noise, the proposed and optimized proposed structures have similar magnitudes levels. Compare with the noise magnitude of conventional structure, the proposed structures reduce the CM noise magnitude by 26 dB at low frequency and lower the DM noise by up to 63 dB within a wide frequency scale.

Figure 52:
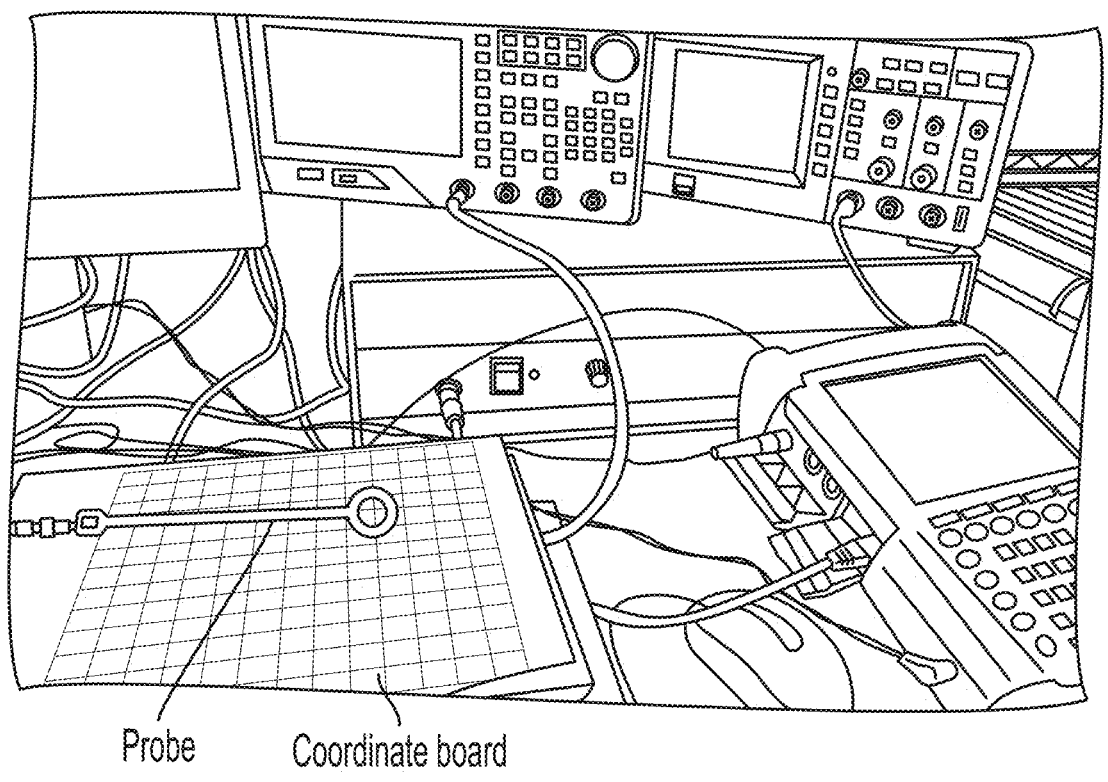
FIG. 52 shows near magnetic field experiment set up.
Figure 53:
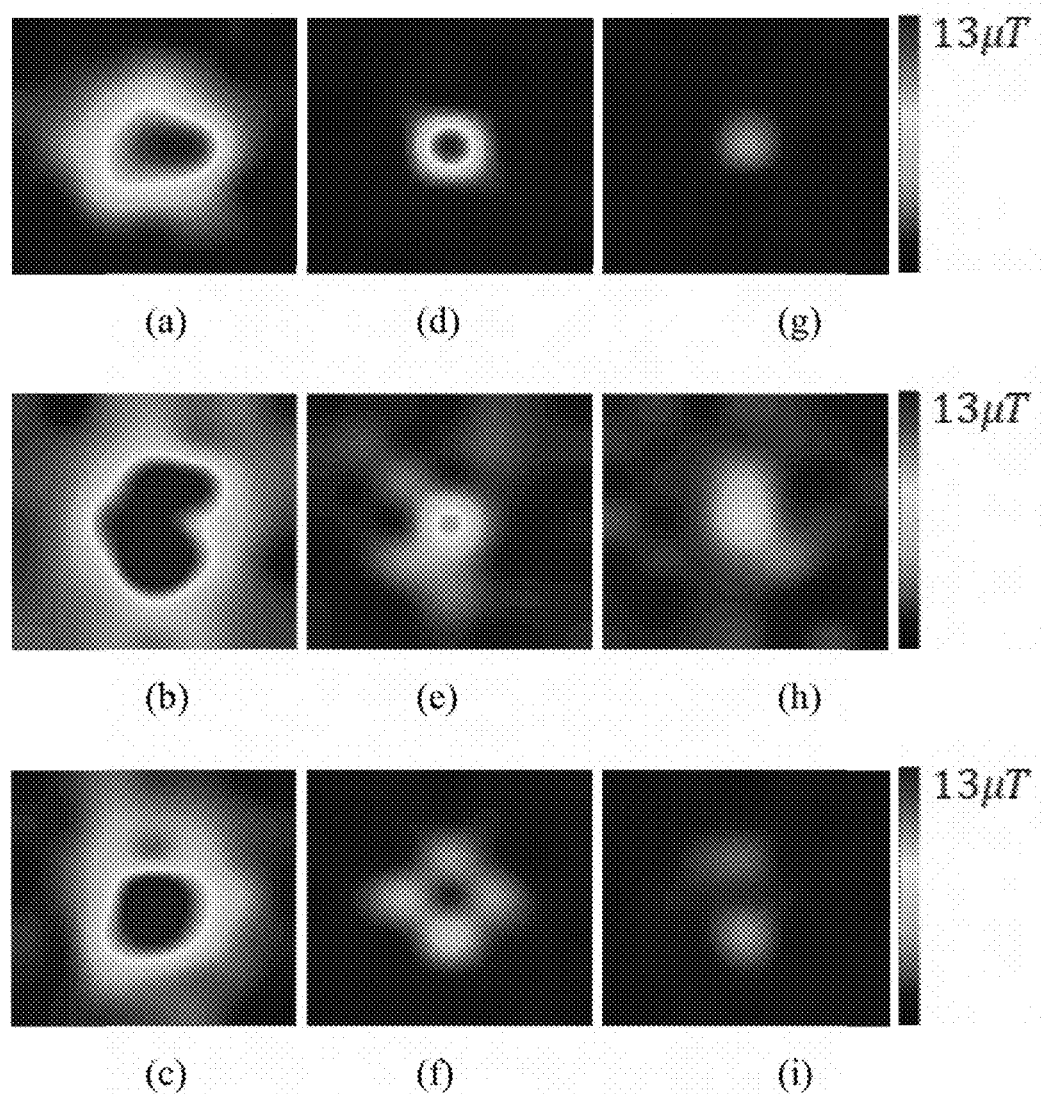
FIG. 53(a) shows measured near magnetic field emission of a conventional inductor measured in x direction.
FIG. 53(b) shows measured near magnetic field emission of conventional inductor measured in y direction.
FIG. 53(c) shows measured near magnetic field emission of conventional inductor measured in z direction.
FIG. 53(d) shows measured near magnetic field emission of a CM inductor according to an embodiment measured in x direction.
FIG. 53(e) shows measured near magnetic field emission of a CM inductor according to an embodiment measured in y direction.
FIG. 53(f) shows measured near magnetic field emission of a CM inductor according to an embodiment measured in z direction.
FIG. 53(g) shows measured near magnetic field emission of an optimized CM inductor according to an embodiment measured in x direction.
FIG. 53(h) shows measured near magnetic field emission of an optimized CM inductor according to an embodiment measured in y direction.
FIG. 53(i) shows measured near magnetic field emission of an optimized CM inductor according to an embodiment measured in z direction.

The near magnetic field was measured with a signal generator RIGOL DG4062, a Beehive Electronics 100C EMC probe, an Amplifier Research Model 25A250A amplifier and a Rohde & Schwarz FSH4 spectrum analyzer. A 200 kHz sinusoidal voltage was applied to the measured inductors and the DM current conducted was controlled to be maintained at 1 A, monitored by a current clamp connected to a RIGAL DE1052E digital oscilloscope. The experiment set up is shown in FIG. 52. There were 7*7=49 measurement points on the coordinate board and the entire measurement area is 20 cm*20 cm.

The measured inductor is placed under the coordinate board and the EMC probe was adjusted to measure the magnetic field in x, y, and z direction at each measurement point. Then the measurement data was exported from the spectrum analyzer to calculate the composite magnetic field density according to equation (31), $$B=\sqrt{B_x^2+B_y^2+B_z^2} \qquad (31)$$

The measurement was carried out at the distance of 25 mm from the inductor from x, y and z direction defined in the previous section. The measurement results are shown in FIGS. 53(a)-53(i). As the figure shows, the near magnetic field emission of proposed and optimized proposed structure can be significantly reduced compared with that of the conventional inductor from all directions. Besides, the optimized proposed inductor has even lower near magnetic field emission than the proposed structure. The experiment results verify the analysis in previous sections.

Figure 54:
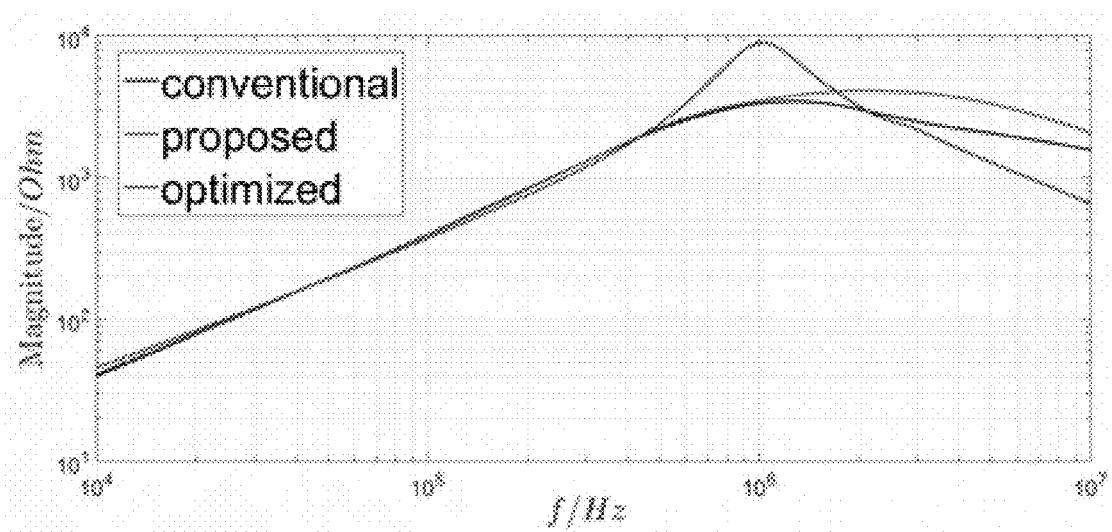
FIG. 54(a) shows CM impedance of the inductors of FIG. 50.
FIG. 54(b) shows DM impedance of the inductors of FIG. 50.
Figure 54:
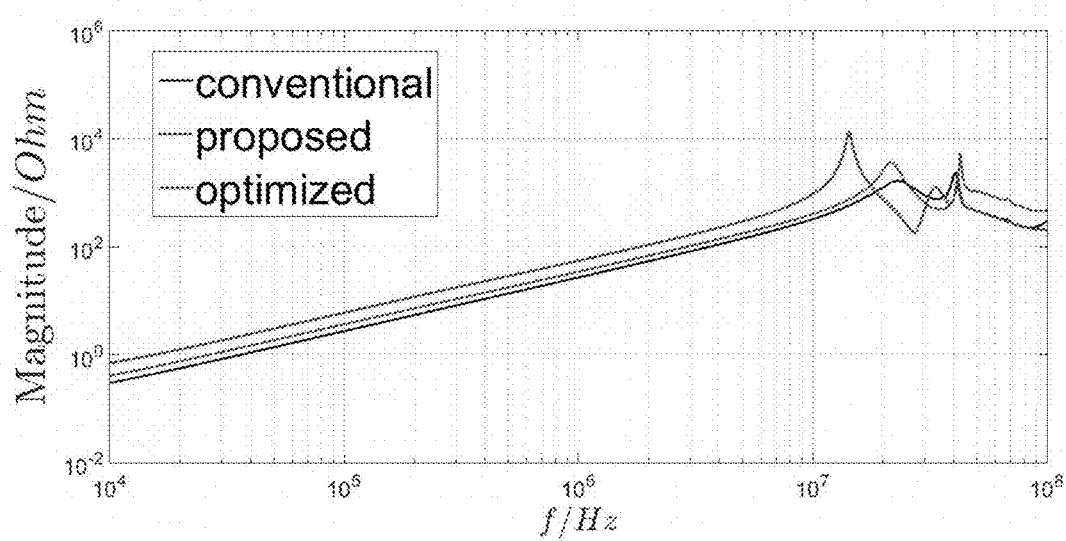

The impedance of the inductors was measured with a KEYSIGHT impedance analyzer. The inductors are all designed to have identical CM impedance as FIG. 54 shows. At low frequency the inductance is L M 637 µH. The DM inductance for the conventional inductor, proposed inductor and optimized proposed inductor are 4.3 µH, 5.9 µH and 9.7 µH respectively.

The induced noise voltage in inductors due to external near magnetic field is investigated. The generation of induced noise voltage in different inductors are analyzed and summarized, and equivalent circuits are developed. Experiments are carried out to verify the analysis. A novel CM inductor with two cores is proposed to achieve near magnetic field emission reduction, immunity against the external magnetic field and DM inductance augment. Furthermore, the optimization technique for the reduction of the emitted near magnetic field from the proposed inductor is investigated and simulations validated the developed technique. The prototypes are developed and experiments are carried out to validate the analysis.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] S. Wang, F. C. Lee, D. Y. Chen and W. G. Odendaal, "Effects of parasitic parameters on EMI filter performance," in *IEEE Transactions on Power Electronics*, vol. 19, no. 3, pp. 869-877, May 2004.

[2] S. Wang, R. Chen, J. D. Van Wyk, F. C. Lee and W. G. Odendaal, "Developing parasitic cancellation technologies to improve EMI filter performance for switching mode power supplies," in *IEEE Transactions on Electromagnetic Compatibility*, vol. 47, no. 4, pp. 921-929, November 2005.

[3] S. Wang, F. C. Lee and J. D. van Wyk, "Design of Inductor Winding Capacitance Cancellation for EMI Suppression," in *IEEE Transactions on Power Electronics*, vol. 21, no. 6, pp. 1825-1832, November 2006. doi: 10.1109/TPEL.2006.882898

[4] Y. Chu, S. Wang, N. Zhang and D. Fu, "A Common Mode Inductor With External Magnetic Field Immunity, Low-Magnetic Field Emission, and High-Differential Mode Inductance," in *IEEE Transactions on Power Electronics*, vol. 30, no. 12, pp. 6684-6694, December 2015.

[5] Y. Chu, S. Wang, J. Xu and D. Fu, "EMI reduction with near field coupling suppression techniques for planar transformers and CM chokes in switching-mode power converters," 2013 *IEEE Energy Conversion Congress and Exposition*, Denver, Colo., 2013, pp. 3679-3686.

[6] C. Labarre and F. Costa, "Circuit Analysis of an EMI Filter for the Prediction of its Magnetic Near-Field Emissions," in *IEEE Transactions on Electromagnetic Compatibility*, vol. 54, no. 2, pp. 290-298, April 2012. doi: 10.1109/TEMC.2011.2159563

[7] T. Q. Van Hoang, A. Bréard and C. Vollaire, "Near Magnetic Field Coupling Prediction Using Equivalent Spherical Harmonic Sources," in *IEEE Transactions on Electromagnetic Compatibility*, vol. 56, no. 6, pp. 1457-1465, December 2014.

[8] R. Wang, H. F. Blanchette, M. Mu, D. Boroyevich and P. Mattavelli, "Influence of High-Frequency Near-Field Coupling Between Magnetic Components on EMI Filter Design," in *IEEE Transactions on Power Electronics*, vol. 28, no. 10, pp. 4568-4579, October 2013.

[9] Taiwei Chen, "Inductor design for Common-mode and Differential mode inductors," M.S dissertation, Department of Electrical and Computer Engineering, University of Texas at San Antonio, 2014

[10] R. Lai, Y. Maillet, F. Wang, S. Wang, R. Burgos and D. Boroyevich, "An Integrated EMI Choke for Differential-Mode and Common-Mode Noise Suppression," in *IEEE Transactions on Power Electronics*, vol. 25, no. 3, pp. 539-544, March 2010.

[11] H. Yang and Z. Lu, "Analysis on near-field effect caused by stray magnetic field of integrated LLC transformer," 2014 *International Power Electronics and Application Conference and Exposition*, Shanghai, 2014, pp. 1349-1352.

[12] W. Tan, C. Cuellar, X. Margueron and N. Idir, "A Common-Mode Choke Using Toroid-EQ Mixed Structure," in *IEEE Transactions on Power Electronics*, vol. 28, no. 1, pp. 31-35, January 2013.

[13] R. Lai, Y. Maillet, F. Wang, S. Wang. R. Burgos and D. Boroyevich, "An integrated EMI choke for differential-mode and common-mode noise suppression." IEEE Trans. Power Electronics, 25(3), 539-544.

[14] M. Nave, "On modeling the common mode inductor," in Proc. IEEE Trans. Electromagn. Compat., 1991, pp. 452-457.

[15] B. Zhang and S. Wang, "Analysis and reduction of the near magnetic field radiation from magnetic inductors," 2017 IEEE Applied Power Electronics Conference and Exposition (APEC), Tampa, Fla., 2017, pp. 2494-2501.

[16] Shuo Wang, F. C. Lee and W. G. Odendaal, "Using scattering parameters to characterize EMI filters," 2004 IEEE 35th Annual Power Electronics Specialists Conference (IEEE Cat. No. 04CH37551), 2004, pp. 297-303 Vol. 1.

[17] S. Wang, P. Kong and F. C. Lee, "Common mode noise reduction for boost converters using general balance technique," 2006 37th IEEE Power Electronics Specialists Conference, Jeju, 2006, pp. 1-6.

[18] S. Wang, F. C. Lee and J. D. van Wyk, "Inductor Winding Capacitance Cancellation Using Mutual Capacitance Concept for Noise Reduction Application," Electromagnetic Compatibility, IEEE Transactions, Volume 48, Issue 2, May, 2006, pp. 311-318.

[19] S. Wang, F. C. Lee and W. G. Odendaal, "Cancellation of Capacitor Parasitic Parameters for Noise Reduction Application," Power Electronics, IEEE Transactions, July, 2006, pp. 1125-1132.

[20] F. S. F. Silva et al., "High gain DC-DC boost converter with a coupling inductor," 2009 Brazilian Power Electronics Conference, Bonito-Mato Grosso do Sul, 2009, pp. 486-492.

[21] H. Zhang, B. Zhang and S. Wang, "Integrated common mode and differential mode inductors with low near magnetic field emission," 2017 IEEE Energy Conversion Congress and Exposition (ECCE), Cincinnati, Ohio, USA, 2017, pp. 5375-5382.

[22] H. Zhang, S. Wang and Q. Wang, "Winding and air gap configurations for power inductors to reduce near magnetic field emission," 2017 IEEE Energy Conversion Congress and Exposition (ECCE), Cincinnati, Ohio, USA, 2017, pp. 903-910.

[23] D. J. Wilcox, M. Conlon and W. G. Hurley, "Calculation of self and mutual impedances for coils on ferromagnetic cores," in IEE Proceedings A—Physical Science, Measurement and Instrumentation, Management and Education—Reviews, vol. 135, no. 7, pp. 470-476, September 1988.

[24] F. C. Lee, J. D. van Wyk, Z. X. Liang, R. Chen, S. Wang and B. Lu, "An integrated power electronics modular approach: concept and implementation," The 4th International Power Electronics and Motion Control Conference, 2004. IPEMC 2004., Xi'an, 2004, pp. 1-13 Vol. 1.

What is claimed is:

1. An inductor structure, comprising:
a first core having an inner diameter A; and
a second core having an outer diameter B, wherein:
A is greater than B,
the second core is within the first core, and
two windings are wrapped around the first core and the second core, wherein (a) a first winding of the two windings winds a first part of the first core, a first part of the second core, a third part of the second core, and a third part of the first core in series, and (b) a second winding of the two windings winds a second part of the first core, a second part of the second core, a fourth part of the second core, and a fourth part of the first core in series.

2. The inductor structure of claim 1, wherein the two windings are symmetrical in both the first core and the second core.

3. The inductor structure of claim 1, wherein the two windings are opposite in direction around the first core.

4. The inductor structure of claim 1, wherein the two windings are opposite in direction around the second core.

5. The inductor structure of claim 1, wherein a first number of turns of each of the two windings on the first core is smaller than a second number of turns of each of the two windings on the second core.

6. The inductor structure of claim 5, wherein a first relative permeability of the first core higher than a second relative permeability of the second core.

7. The inductor structure of claim 1, wherein each of the two windings crosses each other.

8. The inductor structure of claim 1, wherein the second core is spaced apart from the first core to provide an air gap.

9. An inductor device, comprising:
a first core;
a second core disposed inside the first core;
a first wire wrapping the first core and the second core; and a second wire wrapping the first core and the second core, wherein (a) the first wire wraps a first part of the first core, a first part of the second core, a third part of the second core, and a third part of the first core in series, and (b) the second wire wraps a second part of the first core, a second part of the second core, a fourth part of the second core, and a fourth part of the first core in series.

10. The inductor device according to claim 9, wherein the second core is spaced apart from the first core.

11. The inductor device according to claim 9, wherein a first winding number of the first core is less than a second winding number of the second core.

12. The inductor device according to claim 11, wherein a first relative permeability of the first core is higher than a second relative permeability of the second core.

13. The inductor device according to claim 9, wherein the first wire is symmetric to the second wire on the first core.

14. The inductor device according to claim 9, wherein the first wire is symmetric to the second wire on the second core.

15. The inductor device according to claim 9, wherein each of the first core and the second core has a cylindrical shape.

16. The inductor device according to claim 9, wherein the first wire and the second wire are twisted such that the first wire and the second wire cross each other.

17. The inductor device according to claim 16, wherein the first wire and the second wire cross each other inside the second core.

18. An inductor device, comprising:
a first cylindrical core having an inner diameter;
a second cylindrical core having an outer diameter and disposed in the first cylindrical core;
a first wire wrapping a first part of the first cylindrical core, a first part of the second cylindrical core, a third part of the second cylindrical core, and a third part of the first cylindrical core in series; and
a second wire wrapping a second part of the first cylindrical core, a second part of the second cylindrical core, a fourth part of the second cylindrical core, and a fourth part of the first cylindrical core in series,
wherein a first winding number of the first cylindrical core is less than a second winding number of the second cylindrical core, and
wherein the inner diameter of the first cylindrical core is larger than the outer diameter of the second cylindrical core.

* * * * *